United States Patent [19]

Yanagawa et al.

[11] Patent Number: 5,277,215
[45] Date of Patent: Jan. 11, 1994

[54] METHOD FOR SUPPLYING AND DISCHARGING GAS TO AND FROM SEMICONDUCTOR MANUFACTURING EQUIPMENT AND SYSTEM FOR EXECUTING THE SAME

[75] Inventors: Hidehiro Yanagawa; Hiroyuki Nishiuchi; Masakazu Shimada; Mitsuhiro Hirano; Tomoshi Taniyama; Kazumi Nikaido; Yoshikazu Hisajima; Michio Sato, all of Tokyo, Japan

[73] Assignee: Kokusai Electric Co., Ltd., Hamamatsu, Japan

[21] Appl. No.: 7,163

[22] Filed: Jan. 21, 1993

[30] Foreign Application Priority Data

Jan. 28, 1992 [JP] Japan .................. 4-037178
Oct. 7, 1992 [JP] Japan .................. 4-076442[U]

[51] Int. Cl.$^5$ .............................................. F04B 37/14
[52] U.S. Cl. ................................. 137/14; 137/87; 137/571

[58] Field of Search ........................ 137/14, 87, 571; 250/441.11

[56] References Cited

U.S. PATENT DOCUMENTS 4,504,194 3/1985 Holden ..................... 137/571 X

FOREIGN PATENT DOCUMENTS 24574 1/1976 Japan ........................ 137/571

Primary Examiner—Robert G. Nilson
Attorney, Agent, or Firm—Graham & James

[57] ABSTRACT

A plurality of airtight chambers are connected through blocking means, which can communicate or shut off the chambers, and at least one of the airtight chambers is used as a processing chamber. One of the adjacent airtight chambers is replaced by a replacement gas, and the replacement gas is supplied to the other of the adjacent airtight chambers. When pressure difference or pressure in the two adjacent airtight chambers is below a predetermined value, the adjacent two airtight chambers are communicated, and pressure in the two airtight chambers is equalized.

16 Claims, 17 Drawing Sheets

DIFFERENTIAL PRESSURE/VALVE OPENING-
DEFINITION AND MEANS

| DIFFERENTIAL PRESSURE $P(Pa)$ | OPENING OF GAS SUPPLY LINE VALVE $x(l/t)$ | OPENING OF GAS DISCHARGE LINE VALVE $y(l/t)$ |
|---|---|---|
| $P_1$ | $x_1$ | $y_1$ |
| $P_2$ | $x_2$ | $y_2$ |
| $P_3$ | $x_3$ | $y_3$ |
| ⋮ | ⋮ | ⋮ |
| $P_m$ | 0 | 0 |

METHOD FOR SUPPLYING AND DISCHARGING GAS TO AND FROM SEMICONDUCTOR MANUFACTURING EQUIPMENT AND SYSTEM FOR EXECUTING THE SAME

BACKGROUND OF THE INVENTION

The present invention relates to a method for supplying and discharging gas to and from a semiconductor manufacturing equipment and a system for executing such method.

Description is given to the prior art, referring to FIG. 19, which represents a type of semiconductor manufacturing equipment, i.e. a vertical diffusion/CVD system provided with a load-lock chamber.

In a reaction chamber 1, which also serves an airtight chamber and a processing chamber, an airtight load-lock chamber 3 is arranged through a gate valve 2, and a nitrogen gas supply line 4 and a gas discharge line 5 are connected to the reaction chamber 1. Also, a nitrogen gas supply line 6, a gas discharge line 7 and a vacuum pump 8 are connected to the load-lock chamber 3. An air valve 9 is connected to the nitrogen gas supply line, and an air valve 10 to the gas discharge line 7.

The load-lock chamber 3 is provided with a boat inserting device (not shown), which inserts a wafer 12 loaded on a boat 11 into the reaction chamber 1, performs processings such as diffusion, thin film deposition, etc. and takes it out thereafter.

Describing gas supplying and discharging operation in this conventional type vertical diffusion/CVD system, the vacuum pump 8 is driven with the gate valve 2 closed to turn the load-lock chamber 3 to vacuum condition. Then, nitrogen gas is introduced through the nitrogen gas supply line 6 to produce nitrogen gas atmosphere in the load-lock chamber 3 and to reduce oxygen concentration there.

In the conventional type vertical diffusion/CVD system as described above, when nitrogen gas is introduced and the load-lock chamber 3 is turned to nitrogen gas atmosphere, the load-lock chamber 3 is under positive pressure, and pressure difference from the reaction chamber 1 occurs. As the result, when the gate valve 2 is opened, the nitrogen gas flows into the reaction chamber 1 from the load-lock chamber 3 due to the pressure difference, and this induces dusting. Thus, particles increase in the reaction chamber 1 and the load-lock chamber 3, and cleanliness level of the wafer 12 is decreased.

To solve the above problems, it is an object of the present invention to provide a semiconductor manufacturing equipment comprising a vertical diffusion/CVD system, by which it is possible to prevent dusting when the gate valve 2 is opened.

DETAILED DESCRIPTION OF THE PREFERRED EMBODIMENTS

In the following, description will be given on embodiments of the present invention in connection with the drawings.

Figure 1:
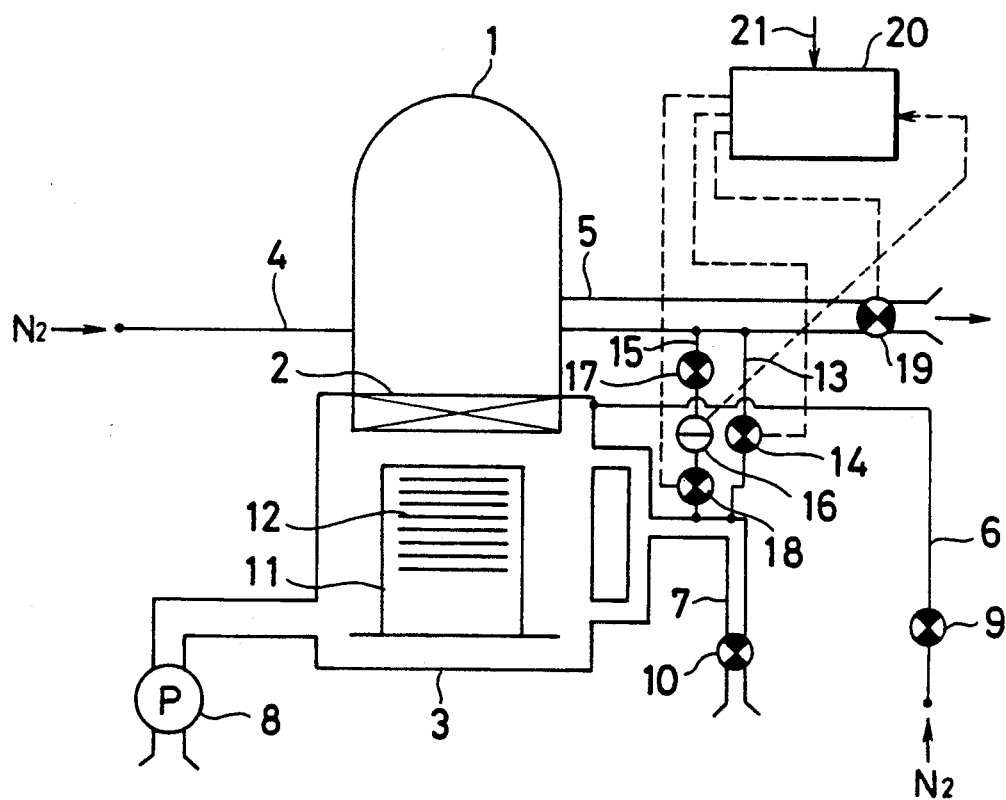
FIG. 1 is a schematical drawing of an embodiment of the present invention.
Figure 19:
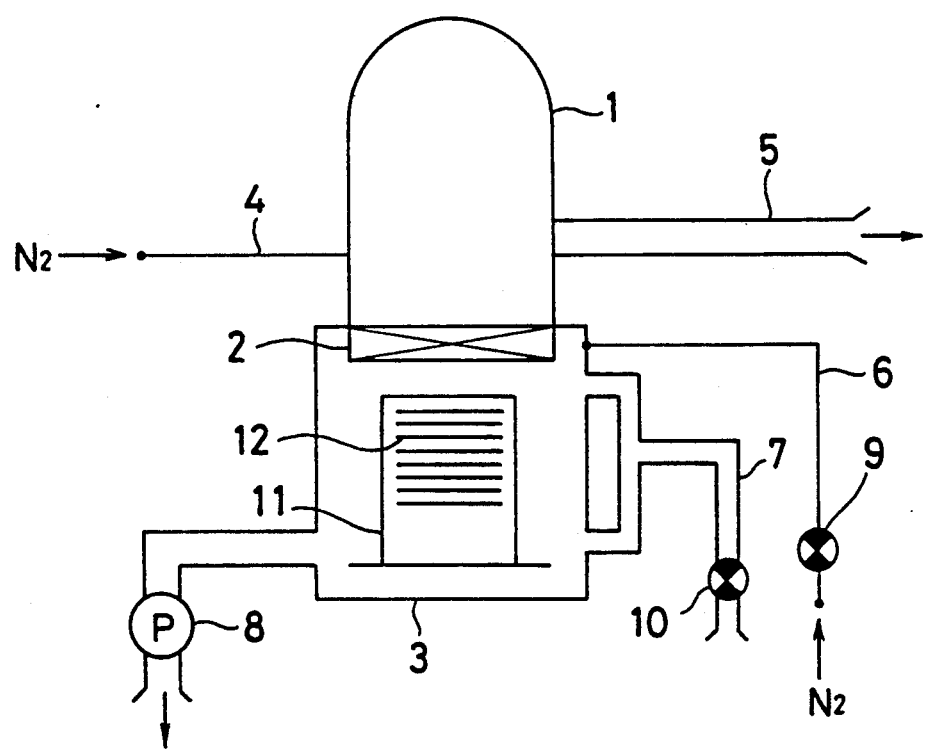
FIG. 19 is a drawing of a conventional example.

FIG. 1 represents a semiconductor manufacturing equipment, i.e. an embodiment of a vertical diffusion/CVD system provided with a load-lock chamber. In the figure, the same component as in FIG. 19 is referred by the same symbol, and detailed description is not given here.

The gas discharge line 5 and the gas discharge line 7 are connected by a connecting pipe 13, and the gas discharge line 5 and the gas discharge line 7 are connected by a differential pressure detecting pipe 15. The connecting pipe 13 is provided with a connecting pipe valve 14, and the differential pressure detecting pipe 15 is provided with two air valves 17 and 18. A differential pressure gauge 16 is disposed between the two air valves 17 and 18. On a portion of the gas discharge line 5 downstream of a connecting point of the connecting pipe 13 and the differential pressure detecting pipe 15, a gas discharge line valve 19 is mounted.

Detection signal from the differential pressure detecting pipe 15 is inputted to a controller 20, and the controller 20 opens or closes the connecting pipe valve 14 according to the result of comparison of a preset reference value 21 and the signal from the differential pressure detecting pipe 15. And, the controller 20 opens or closes an air valve 9, an air valve 10, the air valves 17 and 18 and the gas discharge line valve 19, in accordance with operation sequence of the vertical diffusion/CVD system in order to supply and discharge gas.

Next, description will be given on the operation.

With the connecting pipe valve 14 and the air valves 17 and 18 closed, nitrogen gas is introduced through the nitrogen gas supply line 6 to turn the load-lock chamber 3 to nitrogen gas atmosphere. Then, the two air valves 17 and 18 are opened, and the gas discharge line valve 19 is closed. Through the nitrogen gas supply line 4, nitrogen gas is introduced into the reaction chamber 1.

The pressure difference between the reaction chamber 1 and the load-lock chamber 3 is detected by the differential pressure gauge 16, and the result of the detection is inputted to the controller 20 as described above. The controller 20 compares the result of the detection by the differential pressure gauge 16 with the preset reference value 21. When the detection result becomes lower than the reference value 21, the connecting pipe valve 14 is opened in order to completely eliminate the pressure difference between the reaction chamber 1 and the load-lock chamber 3. When a certain period of time elapsed after the connecting pipe 14 has been opened or when pressure difference is no more monitored by the differential pressure gauge 16, the gate valve 2 is opened.

By this operation, it is possible to suppress rapid flow of gas caused by pressure difference between the reaction chamber 1 and the load-lock chamber 3 when the gate valve 2 is opened, and it is possible to prevent dusting.

Next, description will be given on another embodiment of semiconductor manufacturing equipment in FIG. 2.

A plurality of adjacent processing chambers 101 are connected with each other through gate valves 102, and a nitrogen gas supply line 103 and a gas discharge line 105 are connected to each of the adjacent processing chambers 101. An air valve 104 is connected to the nitrogen gas supply line 103, and an air valve 106 to the gas discharge line 105.

A gas discharge line 105a connected to one of the adjacent processing chambers 101a and a gas discharge line 105b connected to the other of adjacent processing chambers 101b are short-circuited by a connecting pipe 108b, and the gas discharge line 105a and the gas discharge line 105b are connected by a differential pressure detecting pipe 111b.

A connecting pipe valve 107b is mounted on the connecting pipe 108b, and two air valves 110b and 110c are mounted on the differential pressure detecting pipe 111b. A differential pressure gauge 109b is provided between the two air valves 110b and 110c. A gas discharge line valve 106a is mounted on a portion of the gas discharge line 105a downstream of a connecting point of the connecting pipe 108b and the differential pressure detecting pipe 111b. A gas discharge line valve 106b is mounted on a portion of the gas discharge line 105b downstream of a connecting point of the connecting pipe 108b with the differential pressure detecting pipe 111b.

Detection signal from the differential pressure gauge 109b is inputted to a controller 112a, and the controller 112a opens or closes the connecting pipe valve 107b according to the result of comparison of the signal from the differential pressure gauge 109b with a preset reference value 113a. The controller 112a opens or closes the air valves 110b and 110c, the connecting pipe valve 107b, the gas discharge line valve 106a, and the gas discharge line valve 106b in accordance with operation sequence of the semiconductor manufacturing equipment in order to supply and discharge gas.

Similarly, a gas discharge line 105b connected to one of adjacent processing chambers 101b and a gas discharge line 105c connected to the other of adjacent processing chambers 101c are short-circuited by a connecting pipe 108c, and the gas discharge line 105b and the gas discharge line 105c are connected by a differential pressure detecting pipe 111c.

A connecting pipe valve 107c is mounted on the connecting pipe 108c, and two air valves 110d and 110e are mounted on the differential pressure detecting pipe 111c. A differential pressure gauge 109c is provided between the two air valves 110d and 110e. A gas discharge line valve 106b is mounted on a portion of the gas discharge line 105b downstream of a connecting point between the connecting pipe 108c and the differential pressure detecting pipe 111c. A gas discharge line valve 106c is mounted on a portion of the gas discharge line 105c downstream of a connecting point between the connecting pipe 108c and the differential pressure detecting pipe 111c.

Detection signal from the differential pressure gauge 109c is inputted to a controller 112b, and the controller 112b opens or closes the connecting pipe valve 107c according to the result of comparison of the signal from the differential pressure gauge 109c with a preset reference value 113b. The controller 112b opens or closes the air valves 110d and 110e, the connecting pipe valve 107c, the gas discharge line valve 106b, and the gas discharge line valve 106c in accordance with operation sequence of the semiconductor manufacturing equipment in order to supply and discharge gas.

As described above, each of the adjacent processing chambers 101 has a similar gas supply and discharge mechanism.

Description is now given on operation of the present embodiment, referring to one of the adjacent processing chambers 101a and the other processing chamber 101b as well as the gate valve 102b between these two chambers.

With the connecting pipe valve 107b and the air valves 110b and 110c in closed state, nitrogen gas is introduced through a nitrogen gas supply line 103b to turn the other of the adjacent chambers 101b to nitrogen gas atmosphere. Then, the two air valves 110b and 110c are opened, and the gas discharge line valve 106a is closed. Nitrogen gas is then introduced through the nitrogen gas supply line 103a into one of the adjacent processing chambers 101a.

Pressure difference between one of the adjacent processing chambers 101a and the other adjacent processing chamber 101b is detected by the differential pressure gauge 109b, and the result of the detection is inputted to the controller 112a as described above. The controller 112a compares the detection result of the differential pressure gauge 109b with the preset reference value 113a. When the detection result becomes the preset reference value 113a or lower than it, the connecting pipe valve 107b is opened in order to completely eliminate pressure difference between the one adjacent processing chamber 101a and the other adjacent processing chamber 101b. When a certain period of time has elapsed after the connecting pipe valve 107b has been opened or when pressure difference is no more monitored by the differential pressure gauge 109b, the gate valve 102b is opened.

By the arrangement as described above, it is possible to suppress rapid flow of gas caused by pressure difference between one adjacent processing chamber and the other processing chamber when the gate valve is opened.

Figure 3:
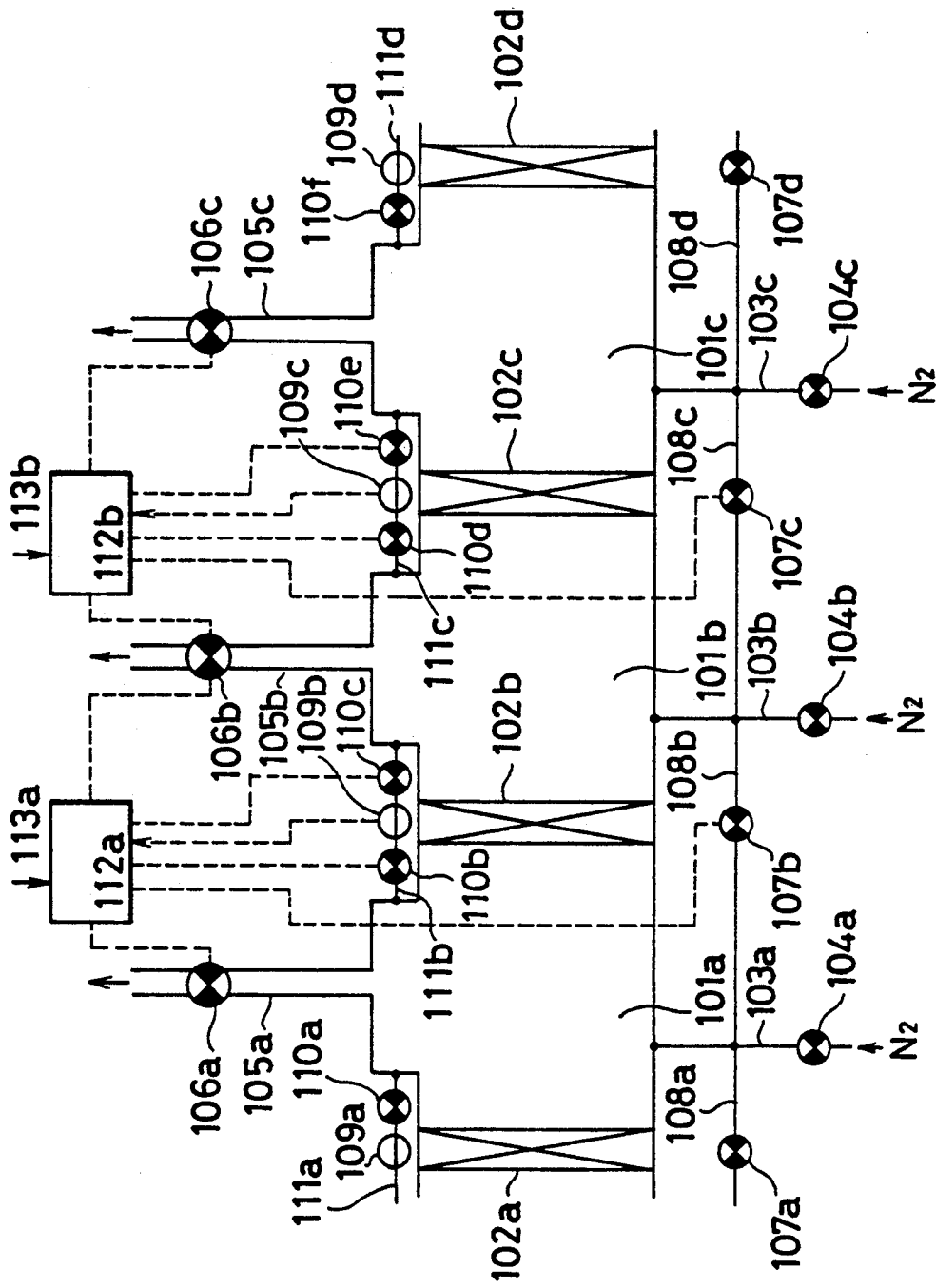
FIG. 3 is a schematical drawing of a still another embodiment of the present invention.

Now, description will be given on an embodiment of the semiconductor manufacturing equipment in FIG. 3.

A plurality of adjacent processing chambers 101 are connected with each other through gate valves 102, and a nitrogen gas supply line 103 and a gas discharge line 105 are connected to each of the adjacent processing chamber 101. An air valve 104 is mounted on the nitrogen gas supply line 103, and an air valve 106 to the gas discharge line 105.

A nitrogen gas supply line 103a connected to one of the adjacent processing chambers 101a and a nitrogen gas supply line 103b connected to the other of adjacent processing chamber 101b are short-circuited by a connection pipe 108b, and one of the adjacent processing chambers 101a and the other adjacent processing chamber 101b are connected by a differential pressure detecting pipe 111b. A connecting pipe valve 107b is mounted on the connecting pipe 108b, and two air valves 110b and 110c are mounted on the differential pressure detecting pipe 111b. A differential pressure gauge 109b is mounted between the two air valves 110b and 110c.

Detection signal from the differential pressure gauge 109b is inputted to a controller 112a, and the controller 112a opens or closes the connecting pipe valve 107b according to the result of comparison of the signal from the differential pressure gauge 109b with a preset reference value 113a. The controller 112a opens or closes the air valves 110b and 110c, the connecting pipe valve 107b, a gas discharge line valve 106a, and a gas discharge line valve 106b in accordance with operation sequence of the semiconductor manufacturing equipment in order to supply and discharge gas.

Similarly, a nitrogen gas supply line 103b connected to one of adjacent processing chambers 101b and a nitrogen gas supply line 103c connected to the other of adjacent processing chamber 101c are short-circuited by a connecting pipe 108c, and one of the adjacent processing chambers 101b and the other adjacent processing chamber 101c are connected by a differential pressure detecting pipe 111c. A connecting pipe valve 107c is mounted on the connecting pipe 108c, and two air valves 110d and 110e are mounted on the differential pressure detecting pipe 111c. A differential pressure gauge 109c is mounted between the two air valves 110d and 110e.

Detection signal from the differential pressure gauge 109c is inputted to the controller 112b, and the controller 112b opens or closes the connecting pipe valve 107c according to the result of comparison of the signal from the differential pressure gauge 109c with a preset reference value 113b. The controller 112b opens or closes the air valves 110d and 110e, the connecting pipe valve 107c, a gas discharge line valve 106b, and a gas discharge line valve 106c in accordance with operation sequence of the semiconductor manufacturing equipment in order to supply and discharge gas.

As described above, each of the adjacent processing chambers 101 has a similar gas supply and discharge mechanism respectively.

Figure 2:
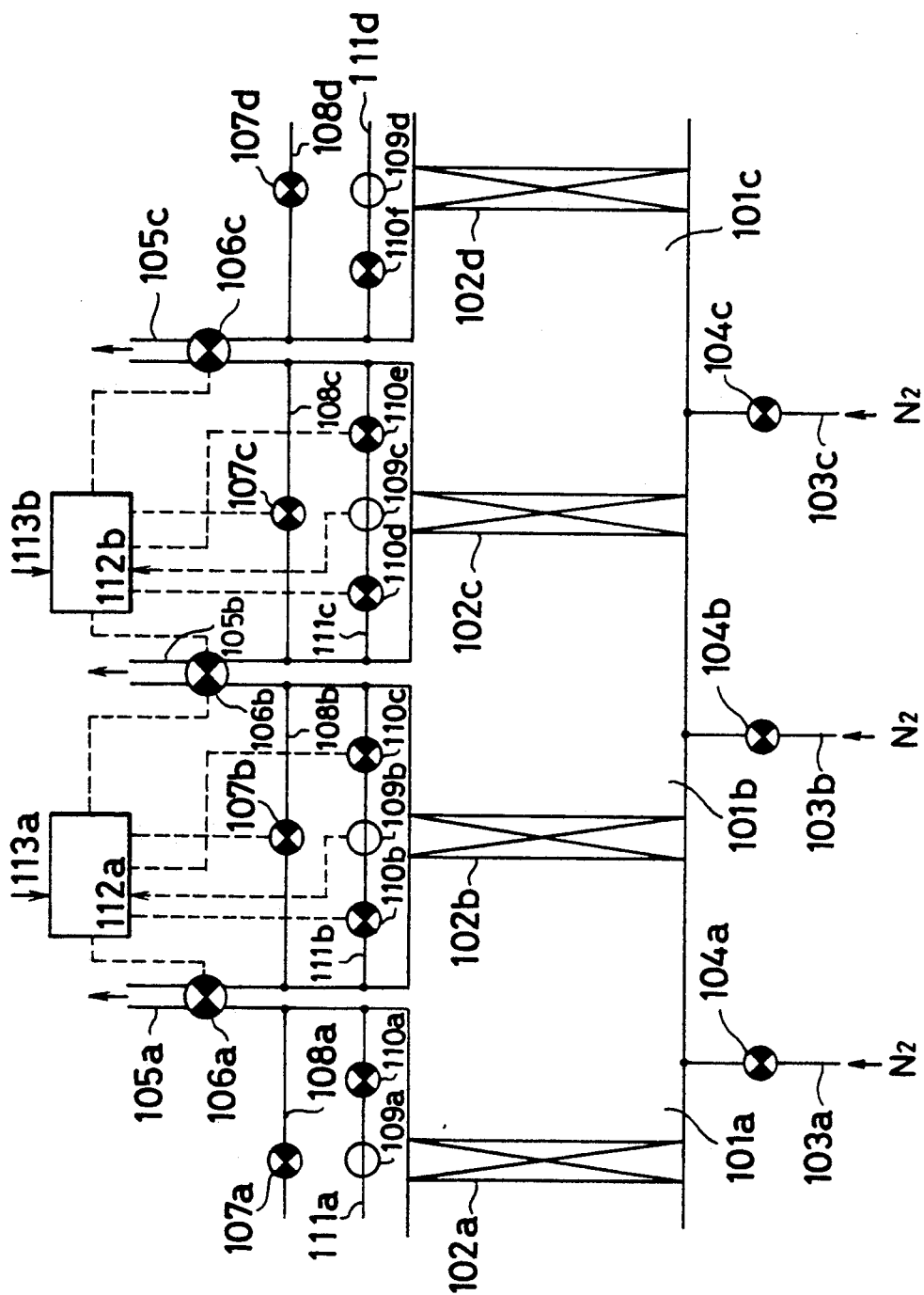
FIG. 2 is a schematical drawing of another embodiment of the present invention.

The operation in the present embodiment is the same as that of the embodiment of FIG. 2.

By the arrangement as described above, it is possible to suppress rapid flow of the gas caused by pressure difference between one and the other of the adjacent processing chambers when the gate valve is opened and to prevent dusting.

Figure 4:
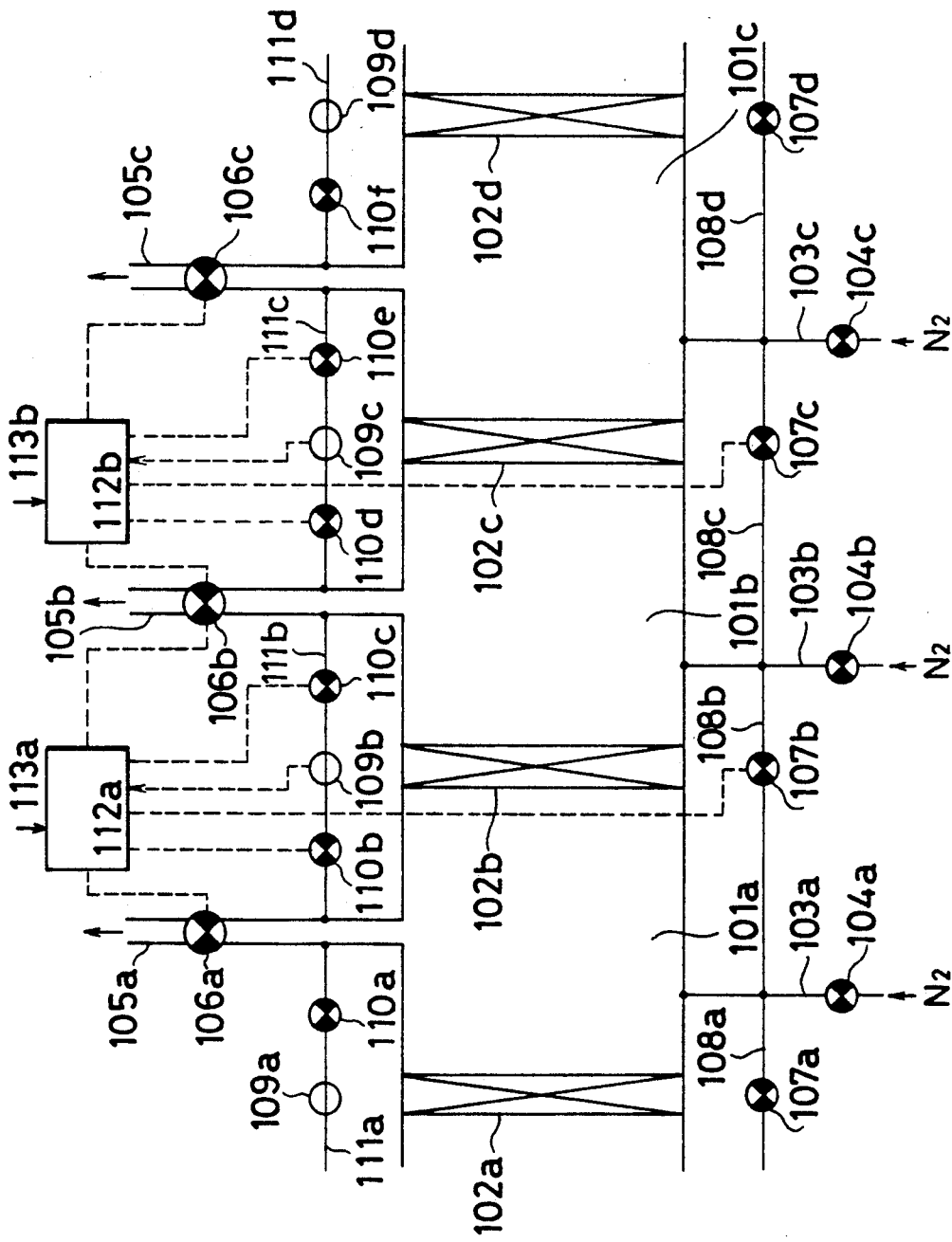
FIG. 4 is a schematical drawing of another embodiment of the present invention.

Description will be given now on an embodiment of the semiconductor manufacturing equipment of FIG. 4.

A plurality of adjacent processing chambers 101 are connected with each other through gate valves 102, and a nitrogen gas supply line 103 and a gas discharge line 105 are connected to each of the adjacent processing chambers 101. An air valve 104 is mounted on the nitrogen gas supply line 103, and an air valve 106 on the gas discharge line 105.

A nitrogen gas supply line 103a connected to one of the adjacent processing chambers 101a and a nitrogen gas supply line 103b connected to the other of adjacent processing chamber 101b are short-circuited by a connecting pipe 108b, and a gas discharge line 105a and a gas discharge line 105b are connected to a differential pressure detecting pipe 111b.

A connecting pipe valve 107b is mounted on the connecting pipe 108b, and two air valves 110b and 110c are mounted on the differential pressure detecting pipe 111b. A differential pressure gauge 109b is mounted between the two air valves 110b and 110c. A gas discharge line valve 106a is mounted on a portion of the gas discharge line 105a downstream of a connecting point of the differential pressure detecting pipe 111b. A gas discharge line valve 106b is mounted on a portion of the gas discharge line 105b downstream of a connecting point of the differential pressure detecting pipe 111b.

Detection signal from the differential pressure gauge 109b is inputted to a controller 112a, and the controller 112a opens or closes the connecting pipe valve 107b according to the result of comparison of the signal from the differential pressure gauge 109b with a preset reference value 113a. The controller 112 opens or closes the air valves 110b and 110c, the connecting pipe valve 107b, the gas discharge line valve 106a and the gas discharge line valve 106b in accordance with operation sequence of the semiconductor manufacturing equipment in order to supply and discharge gas.

Similarly, a nitrogen gas supply line 103b connected to one of adjacent processing chambers 101b and a nitrogen gas supply line 103c connected to the other of adjacent processing chamber 101c are short-circuited by a connecting pipe 108c, and a gas discharge line 105b and a gas discharge line 105c are connected by a differential pressure detecting pipe 111c.

A connecting pipe valve 107c is mounted on the connecting pipe 108c, and two air valves 110d and 110e are mounted on the differential pressure detecting pipe 111c. A differential pressure gauge 109c is mounted between the two air valves 110d and 110e. A gas discharge line valve 106b is mounted on a portion of the gas discharge line 105b downstream of a connecting point of the differential pressure detecting pipe 111c. A gas discharge line valve 106c is mounted on a portion downstream of a connecting point of the differential pressure detecting pipe 111c.

Detection signal from the differential pressure gauge 109c is inputted to the controller 112b, and the controller 112b opens or closes the connecting pipe valve 107c according to the result of comparison of the signal from the differential pressure gauge 109c with a preset reference value 113b. The controller 112b opens or closes the air valves 110d and 110e, the connecting pipe valve 107c, the gas discharge line valve 106b, and the gas discharge line valve 106c in accordance with operation sequence of the semiconductor manufacturing equipment in order to supply and discharge gas.

As described above, each of the adjacent processing chambers 101 is provided with a gas supply and discharge mechanism respectively.

The operation of the present embodiment is the same as that of the embodiment in FIG. 2.

By the arrangement as described above, it is possible to suppress rapid flow of gas caused by pressure difference between one and the other of the adjacent processing chambers when the gate valve is opened, and to prevent dusting.

Figure 5:
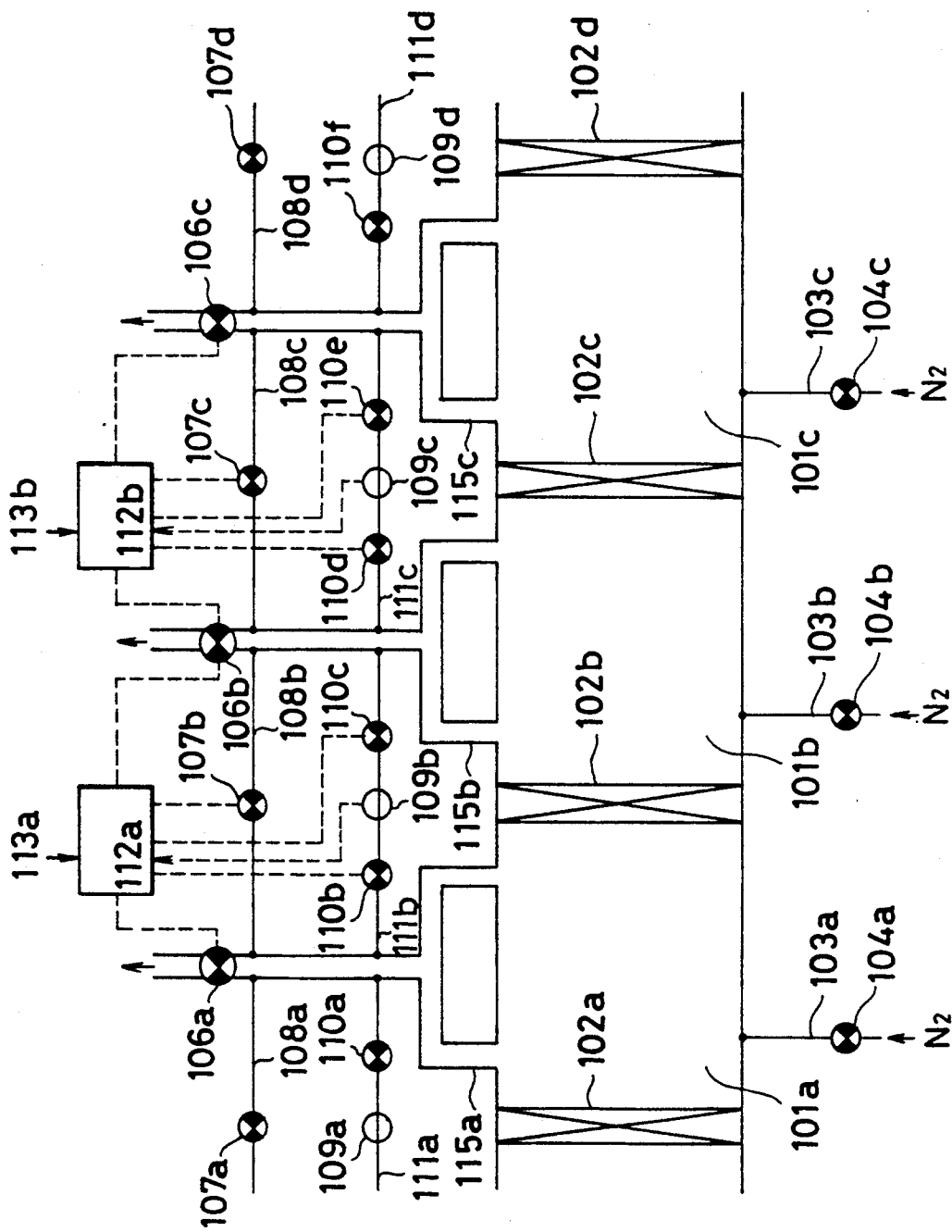
FIG. 5 is a schematical drawing of another embodiment of the present invention.

Description will be given now on an embodiment of the semiconductor manufacturing equipment of FIG. 5.

A plurality of adjacent processing chambers 101 are connected with each other by gate valves 102, and a nitrogen gas supply line 103 are connected, and a gas discharge line 115 are connected in bent and branched state to each of the adjacent processing chambers 101. An air valve 104 is mounted on the nitrogen gas supply line 103 and an air valve 106 is mounted on the gas discharge line 115.

A gas discharge line 115a connected to one of the adjacent processing chambers 101a and a gas discharge line 115b connected to the other of adjacent processing chamber 101b are short-circuited by a connecting pipe 108b, and the gas discharge line 115a and the gas discharge line 115b are connected by a differential pressure detecting pipe 111b.

A connecting pipe valve 107b is mounted on the connecting pipe 108b, and two air valves 110b and 110c are mounted on the differential pressure detecting pipe 111b. A differential pressure gauge 109b is mounted between the two air valves 110b and 110c. A gas discharge line valve 106a is mounted on a portion of the gas discharge line 115a downstream of a connecting point of the connecting pipe 108b and the differential pressure detecting pipe 111b. A gas discharge line valve 106b is mounted on a portion of the gas discharge line 115b downstream of a connecting point of the connecting pipe 108b and the differential pressure connecting pipe 111b.

Detection signal from the differential pressure gauge 109b is inputted to a controller 112a, and the controller 112a opens or closes the connecting pipe valve 107b according to the result of comparison of the signal from the differential pressure gauge 109b with a preset reference value 113a. The controller 112 opens or closes the air valves 110b and 110c, the connecting pipe valve 107b, the gas discharge line valve 106a, and the gas discharge line valve 106b in accordance with operation sequence of the semiconductor manufacturing equipment in order to supply and discharge gas.

Similarly, a gas discharge line 115b connected to one of the adjacent processing chambers 101b and a gas discharge line 115c connected to the other of adjacent processing chamber 101c are short-circuited by a connecting pipe 108c, and the gas discharge line 115b and the gas discharge line 115c are connected by a differential pressure detecting pipe 111c.

A connecting pipe 107c is mounted on the connecting pipe 108c, and air valves 110d and 110e are mounted on the differential pressure detecting pipe 111c. A differential pressure gauge 109c is mounted between the two air valves 110d and 110e. A gas discharge line valve 106b is mounted on a portion of the gas discharge line 105b downstream of a connecting point of the connecting pipe 108c and the differential pressure detecting pipe 111c. A gas discharge line valve 106c is mounted on a portion of the gas discharge line 115c downstream of a connecting point of the connecting pipe 108c and the differential pressure pipe 111c.

Detection signal from the differential pressure gauge 109c is inputted to a controller 112b, and the controller 112b opens or closes the connecting pipe valve 107c according to the result of the signal from the differential pressure gauge 109c and a preset reference value 113b. The controller 112b opens or closes the air valves 110d and 110e, the connecting pipe valve 107c, the gas discharge line valve 106b, and the gas discharge line valve 106c in accordance with operation sequence of the semiconductor manufacturing equipment in order to supply and discharge gas.

As described above, each of the adjacent processing chambers 101 is provided with a similar gas supply and discharge mechanism.

The operation of the present embodiment is the same as that of the embodiment of FIG. 2.

By the arrangement as described above, it is possible to suppress rapid flow of gas caused by the pressure difference between one and the other of the adjacent processing chambers when the gate valve 102 is opened, and to prevent dusting. Further, since the gas discharge line 115 is not straight, it is possible to prevent the back flow of dust such as particles.

It is needless to say that this can be achieved in any conditions in the processing chambers, i.e. reduced pressure, atmospheric pressure or pressurized conditions, when the gate valve 102 between the adjacent processing chambers is opened and the pressure in the two processing chambers is equalized.

Figure 6:
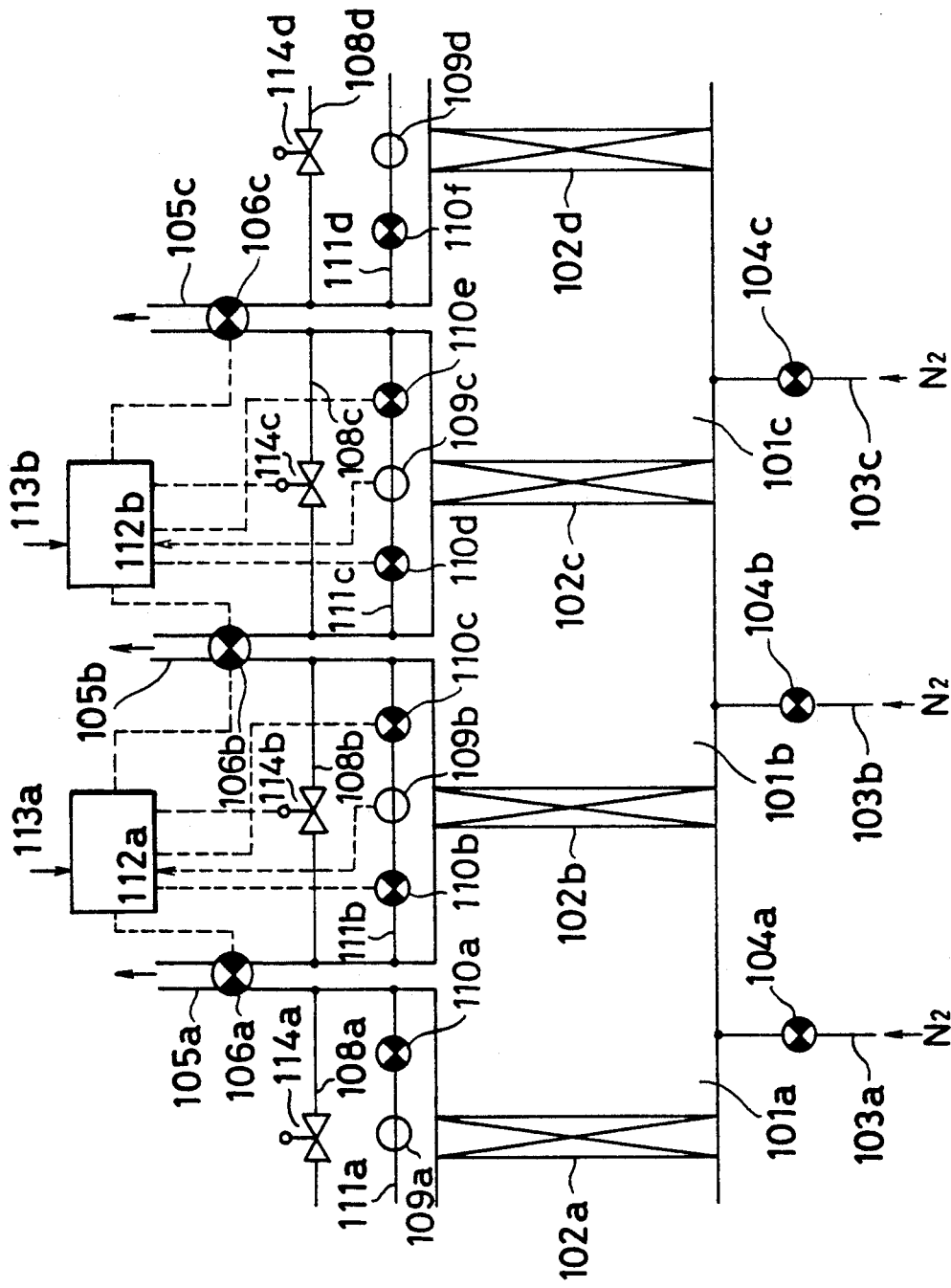
FIG. 6 is a schematical drawing of another embodiment of the present invention.

Description is now given on an embodiment of the semiconductor manufacturing equipment of FIG. 6.

A plurality of adjacent processing chambers 101 are connected with each other through gate valves 102, and a nitrogen gas supply line 103 and a gas discharge line 105 are connected to each of the adjacent processing chambers 101. An air valve 104 is mounted on the nitrogen gas supply line 103, and an air valve 106 on the gas discharge line 105.

A gas discharge line 105a connected to one of the adjacent processing chambers 101a and a gas discharge line 105b connected to the other of the adjacent processing chambers 101b are short-circuited by a connecting pipe 108b, and the gas discharge line 105a and the gas discharge line 105b are connected by a differential pressure detecting pipe 111b.

A flow control valve 114b is mounted on the connecting pipe 108b, and two air valves 110b and 110c are mounted on the differential pressure detecting pipe 111b. A differential pressure gauge 109b is mounted between the two air valves 110b and 110c. A gas discharge line valve 106a is mounted on a portion of the gas discharge line 105a downstream of a connecting point of the connecting pipe 108b and the differential pressure detecting pipe 111b. A gas discharge line valve 106b is mounted on a portion of the gas discharge line 105b downstream of a connecting point of the connecting pipe 108b and the differential pressure detecting pipe 111b.

Detection signal from the differential pressure gauge 109b is inputted to a controller 112a, and the controller 112a opens or closes the flow control valve 114b according to the result of comparison of the signal from the differential pressure gauge 109b and a preset reference value 113a. The controller 112a opens or closes the air valves 110b and 110c, the flow control valve 114b, the gas discharge line valve 106a and the gas discharge line valve 106b in accordance with operation sequence of the semiconductor manufacturing equipment in order to supply and discharge gas.

Similarly, a gas discharge line 105b connected to one of the adjacent processing chambers 101b and a gas discharge line 105c connected to the other of the adjacent processing chambers 101c are short-circuited by a connecting pipe 108c, and the gas discharge line 105b and the gas discharge line 105c are connected by a differential pressure detecting pipe 111c.

A flow control valve 114c is mounted on the connecting pipe 108c, and two air valves 110d and 110e are mounted on the differential pressure detecting pipe 111c. A differential pressure gauge 109c is mounted between the two air valves 110d and 110e. A gas discharge line valve 106b is mounted on a portion of the gas discharge line 105b downstream of a connecting point of the connecting pipe 108c and the differential pressure detecting pipe 111c. A gas discharge line valve 106c is mounted on a portion of the gas discharge line 105c downstream of a connecting point of the connecting pipe 108c and the differential pressure detecting pipe 111c.

Detection signal from the differential pressure gauge 109c is inputted to a controller 112b, and the controller 112b opens or closes the flow control valve 114c according to the result of comparison of the signal from the differential pressure gauge 109c with a preset reference value 113b. The controller 112b opens or closes the air valves 110d and 110e, the flow control valve 114c, the gas discharge line valve 106b and the gas discharge line valve 106c in accordance with operation sequence of the semiconductor manufacturing equipment in order to supply and discharge gas.

As described above, each of the adjacent processing chambers 101 is provided with a similar gas supply and discharge mechanism respectively.

Description is now given on the operation of the present embodiment, referring to one of the adjacent processing chambers 101a and the other of the adjacent processing chambers 101b as well as the gate valve 102b between them.

With the flow control valve 114b and the air valves 110b and 110c in closed state, nitrogen gas is introduced through a nitrogen gas supply line 103b, and the other of the adjacent processing chambers 101b is turned to nitrogen gas atmosphere. Then, the two air valves 110b and 110c are opened, and the gas discharge line valve 106a is closed. Nitrogen gas is introduced through the nitrogen gas supply line 103a into one of the adjacent processing chambers 101a.

Pressure difference between one of the adjacent processing chambers 101a and the other of the adjacent processing chambers 101b is detected by the differential pressure gauge 109b, and the result of detection is inputted to the controller 112a as described above. The controller 112a compares the detection result of the differential pressure gauge 109b with the preset reference value 113a. When the detection result becomes the preset reference value 113a or lower than it, the flow control valve 114b is gradually opened in order to completely eliminate the pressure difference between one of the adjacent processing chambers 101a and the other of the adjacent processing chambers 101b.

By the arrangement as described above, it is possible to suppress rapid flow of gas caused by the pressure difference between one and the other of the adjacent processing chambers when the gate valve is opened, and to prevent dusting.

Figure 7:
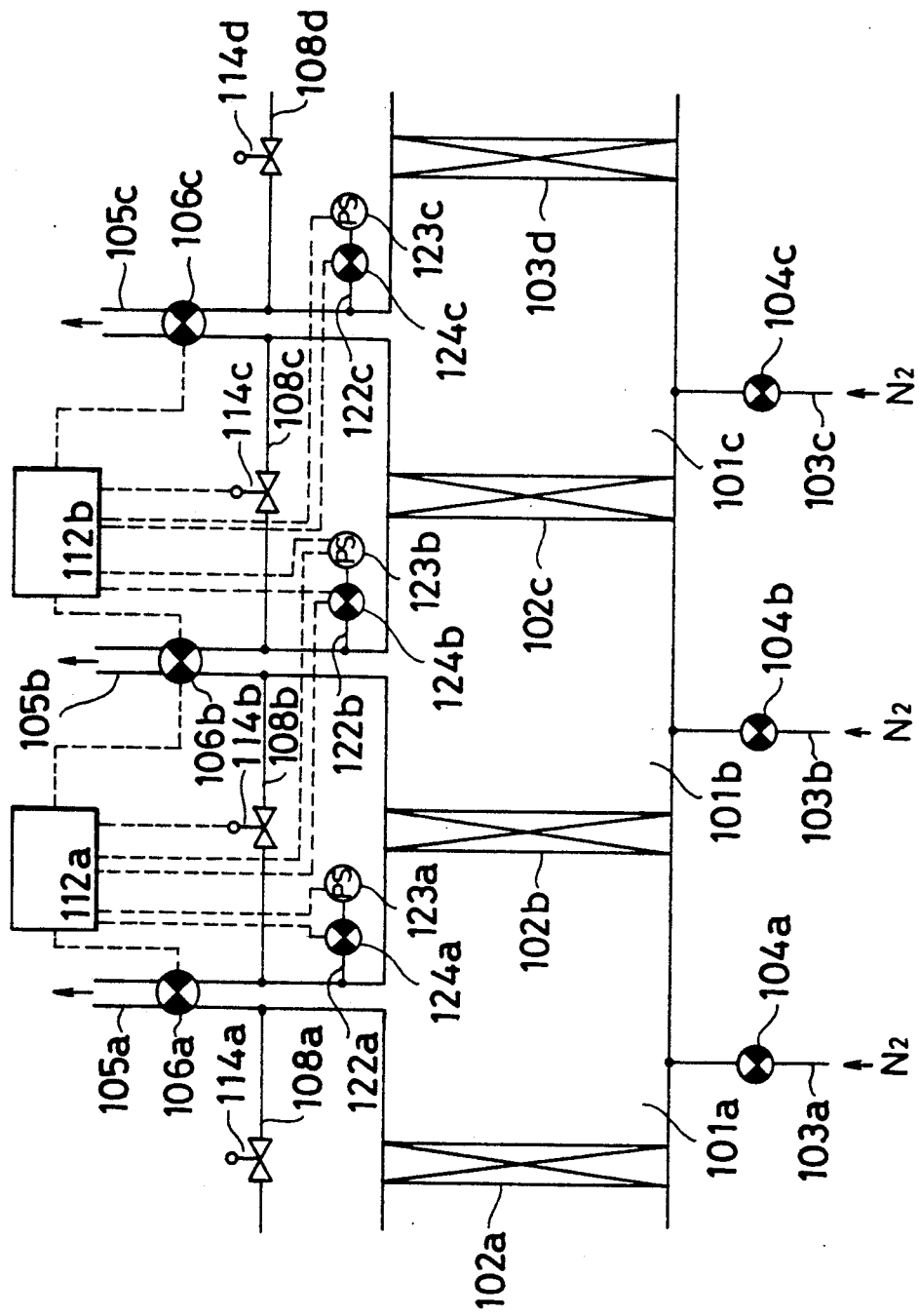
FIG. 7 is a schematical drawing of another embodiment of the present invention.

Description is now given on an embodiment of the semiconductor manufacturing equipment of FIG. 7.

A plurality of adjacent processing chambers 101 is connected with each other through gate valves 102, and a nitrogen gas supply line 103 and a gas discharge line 105 are connected to each of the adjacent processing chambers 101. An air valve 104 is mounted on the nitrogen gas supply line 103 and an air valve 106 on the gas discharge line 105.

A gas discharge line 105a connected to one of the adjacent processing chambers 101a and a gas discharge line 105b connected to the other of the adjacent processing chambers 101b are short-circuited by a connecting pipe 108b. A flow control valve 114b is mounted on the connecting pipe 108b. A pressure detecting pipe 122a is connected to the gas discharge line 105a, and an air valve 124a and a pressure switch 123a are mounted on the pressure detecting pipe 122a. A pressure detecting pipe 122b is connected to a gas discharge line 105b, and an air valve 124b and a pressure switch 123b are mounted on the pressure detecting pipe 122b. A gas discharge line valve 106a is mounted on a portion of the gas discharge line 105a downstream of a connecting point of the connecting pipe 108b and the pressure detecting pipe 122a. A gas discharge line valve 106b is mounted on a portion of the gas discharge line 105b downstream of a connecting point of the connecting pipe 108b, and the pressure detecting pipe 122b.

Detection signals from the pressure switches 123a and 123b are inputted to a controller 112a, and the flow control valve 114b is opened or closed. The controller 112a opens or closes the air valves 124a and 124b, the flow control valve 114b, the gas discharge line valve 106a, and the gas discharge line valve 106b in accordance with operation sequence of the semiconductor manufacturing equipment in order to supply and discharge gas.

Similarly, a gas discharge line 105b connected to one of the adjacent processing chambers 101b and a gas discharge line 105c connected to the other of the adjacent processing chambers 101c are short-circuited by a connecting pipe 108c, and a flow control valve 114c is mounted on the connecting pipe 108c. A pressure detecting pipe 122b is connected to the gas discharge line 105b, and an air valve 124b and a pressure switch 123b are mounted on the pressure detecting pipe 122b. A pressure detecting pipe 122c is connected to the gas discharge line 105c, and an air valve 124c and a pressure switch 123c are mounted on the pressure detecting valve 122c. A gas discharge line valve 106b is mounted on a portion of the gas discharge line 105b downstream of a connecting point of the connecting pipe 108c and the pressure detecting pipe 122b. A gas discharge line valve 106c is mounted on a portion of the gas discharge line 105c downstream of a connecting point of the connecting pipe 108c and the pressure detecting pipe 122c.

Detection signals from the pressure switches 123b and 123c are inputted to a controller 112b, and the flow control valve 114c is opened or closed. The controller 112b opens or closes the air valves 124b and 124c, the flow control valve 114c, the gas discharge line valve 106b and the gas discharge line valve 106c in accordance with operation sequence of the semiconductor manufacturing equipment in order to supply and discharge gas.

As described above, each of the adjacent processing chambers 101 is provided with a similar gas supply and discharge mechanism respectively.

Description is now given on the operation of the present embodiment, referring to one of the adjacent processing chambers 101a and the other of the adjacent processing chambers 101b as well as the gate valve 102b between them.

With the flow control valve 114b in closed state and the air valve 124b in opened state, nitrogen gas is introduced through a nitrogen gas supply line 103b, and the other of the adjacent processing chambers 101b is turned to nitrogen gas atmosphere. Then, the gas discharge line valve 106a is closed and the air valve 124a is opened, and nitrogen gas is introduced through the nitrogen gas supply line 103a into one of the adjacent processing chambers 101a.

The pressure values in one of the adjacent processing chambers 101a and the other of the adjacent processing chambers 101b are detected by the pressure switches 123a and 123b respectively. The operation pressure of the pressure switches 123a and 123b are set in equal. When both of the pressure switches 123a and 123b detect that the pressure is the operation pressure or higher than it and the operation signal from the pressure switches 123a and 123b are inputted to the controller 112a, the flow control valve 114b is gradually opened in order to completely eliminate the pressure difference between one of the adjacent processing chambers 101a and the other of the adjacent processing chambers 101b.

By the arrangement as described above, it is possible to suppress rapid flow of gas caused by the pressure difference between one and the other of the adjacent processing chambers when the gate valve is opened, and to prevent dusting.

Figure 8:
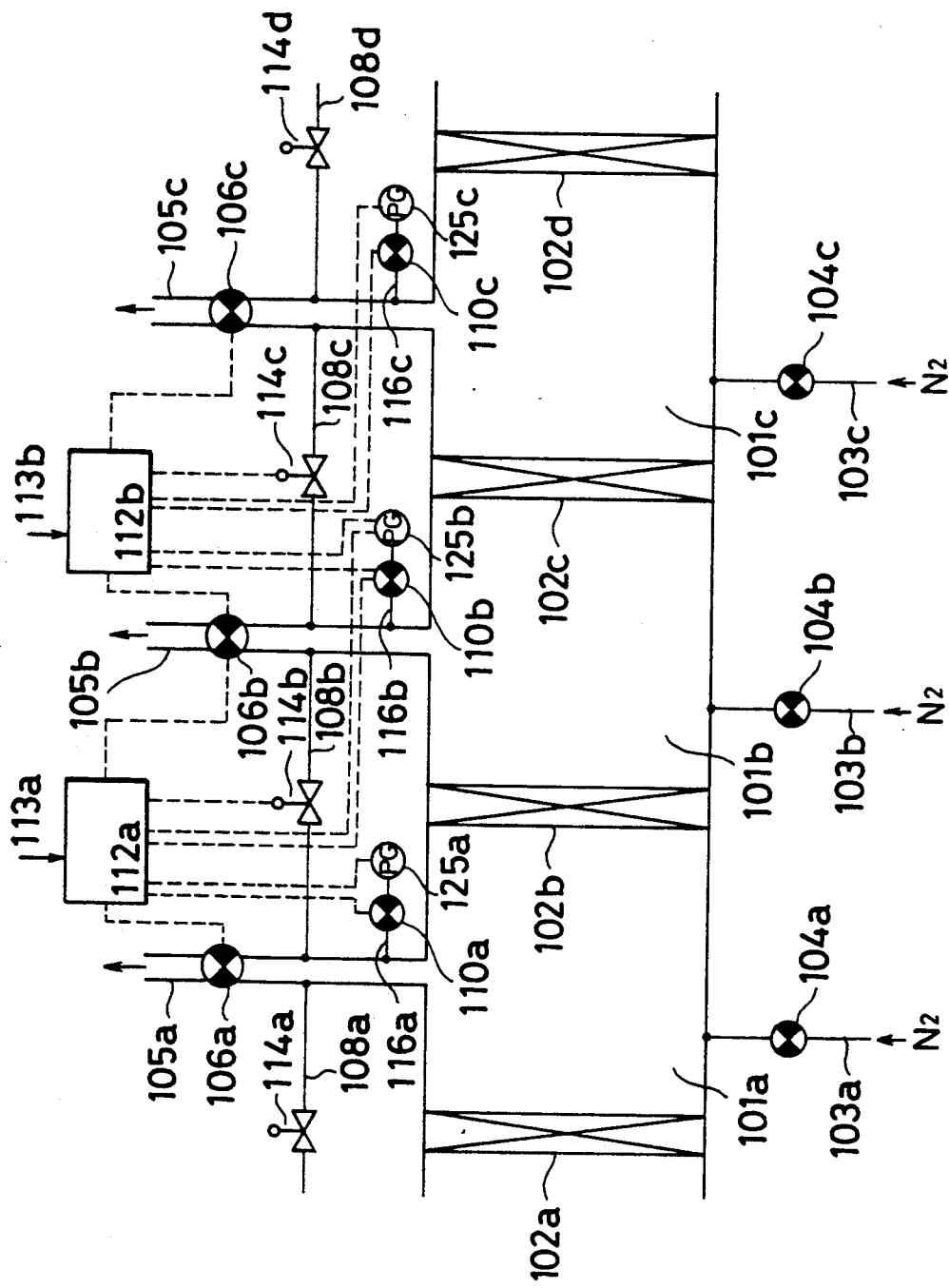
FIG. 8 is a schematical drawing of another embodiment of the present invention.

Description is now given on an embodiment of the semiconductor manufacturing equipment in FIG. 8.

A plurality of adjacent processing chambers 101 are connected with each other through gate valves 102, and a nitrogen gas supply line 103 and a gas discharge line 105 are connected to each of the adjacent processing chambers 101. An air valve 104 is mounted on the nitrogen gas supply line 103, and an air valve 106 on the gas discharge line 105.

A gas discharge line 105a connected to one of the adjacent processing chambers 101a and a gas discharge line 105b connected to the other of the adjacent processing chambers 101b are short-circuited by a connecting pipe 108b. A flow control valve 114b is mounted on the connecting pipe 108b.

A pressure monitor pipe 116a is connected to the gas discharge line 105a, and an air valve 110a and a pressure gauge 125a are mounted on the pressure monitor pipe 116a. The pressure monitor pipe 116b is connected to the gas discharge line 105b, and an air valve 110b and a pressure gauge 125b are mounted on the pressure monitor pipe 116b.

A gas discharge line valve 106a is mounted on a portion of the gas discharge line 105a downstream of a connecting point of the connecting pipe 108b and the pressure monitor pipe 116a. A gas discharge line valve 106b is mounted on a portion of the gas discharge line 105b downstream of a connecting point of the connecting pipe 108b and the pressure monitor pipe 116b.

Detection signals from the pressure gauge 125a and 125b are inputted to a controller 112a, and the controller 112a compares the difference between the signals from the pressure gauge 125a and 125b with a preset reference value 113a, and the flow control valve 114b is opened or closed. Also, the controller 112a opens or closes the air valves 110a and 110b, the flow control valve 114b, the gas discharge line valve 106a and the gas discharge line valve 106b in accordance with operation sequence of the semiconductor manufacturing equipment in order to supply and discharge gas.

A gas discharge line 105b connected to one of the adjacent processing chambers 101b and a gas discharge line 105c connected to the other of the adjacent processing chambers 101c are short-circuited by a connecting pipe 108c, and a flow control valve 114c is mounted on the connecting pipe 108c.

A pressure monitor pipe 116b is connected to the gas discharge line 105b, and an air valve 110b and a pressure gauge 125b are mounted on the pressure monitor pipe 116b. A pressure monitor pipe 116c is connected to the gas discharge line 105c, and an air valve 110c and a pressure gauge 125c are mounted on the pressure monitor pipe 116c. A gas discharge line valve 106b is mounted on a portion of the gas discharge line 105b downstream of a connecting point of the connecting pipe 108c and the pressure monitor pipe 116b. A gas discharge line valve 106c is mounted on a portion of the gas discharge line 105c downstream of a connecting point of the connecting pipe 108c and the pressure monitor pipe 116c.

Detection signals from the pressure gauge 125b and 125c are inputted to a controller 112b, and the controller 112b compares the difference between the signals from the pressure gauge 125b and 125c with a preset reference value 113b, and the flow control valve 114c is opened or closed. The controller 112b opens or closes the air valves 110b and 110c, the flow control valve 114c, the gas discharge line valve 106b, and the gas discharge line valve 106c in accordance with operation sequence of the semiconductor manufacturing equipment in order to supply and discharge gas.

As described above, each of the adjacent processing chambers 101 is provided with a similar gas supply and discharge mechanism respectively.

Description is now given on the operation of the present embodiment, referring to one of the adjacent processing chambers 101a and the other of the processing chambers 101b as well as the gate valve 102b between them.

With the flow control valve 114b in closed state and the air valve 110b in opened state, nitrogen gas is introduced through a nitrogen gas supply line 103b, and the other of the adjacent processing chambers 101b is turned to nitrogen gas atmosphere. Then, the gas discharge line valve 106a is closed and the air valve 110a is opened, and nitrogen gas is introduced through the nitrogen gas supply line 103a into one of the adjacent processing chambers 101a.

The pressure values in one of the adjacent processing chambers 101a and the other of the adjacent processing chambers 101b are detected by the pressure gauges 125a and 125b respectively and the results are inputted to the controller 112a. The difference between the detection results of the pressure gauges 125a and 125b is compared with the preset reference value 113a. When the difference of the detection value becomes the preset reference value 113a or smaller than it, the flow control valve 114b is gradually opened in order to completely eliminate the pressure difference between one of the adjacent processing chambers 101a and the other of the adjacent processing chambers 101b.

By the arrangement as described above, it is possible to suppress rapid flow of gas caused by the pressure difference between one and the other of the adjacent processing chambers when the gate valve is opened, and to prevent dusting.

Figure 9:
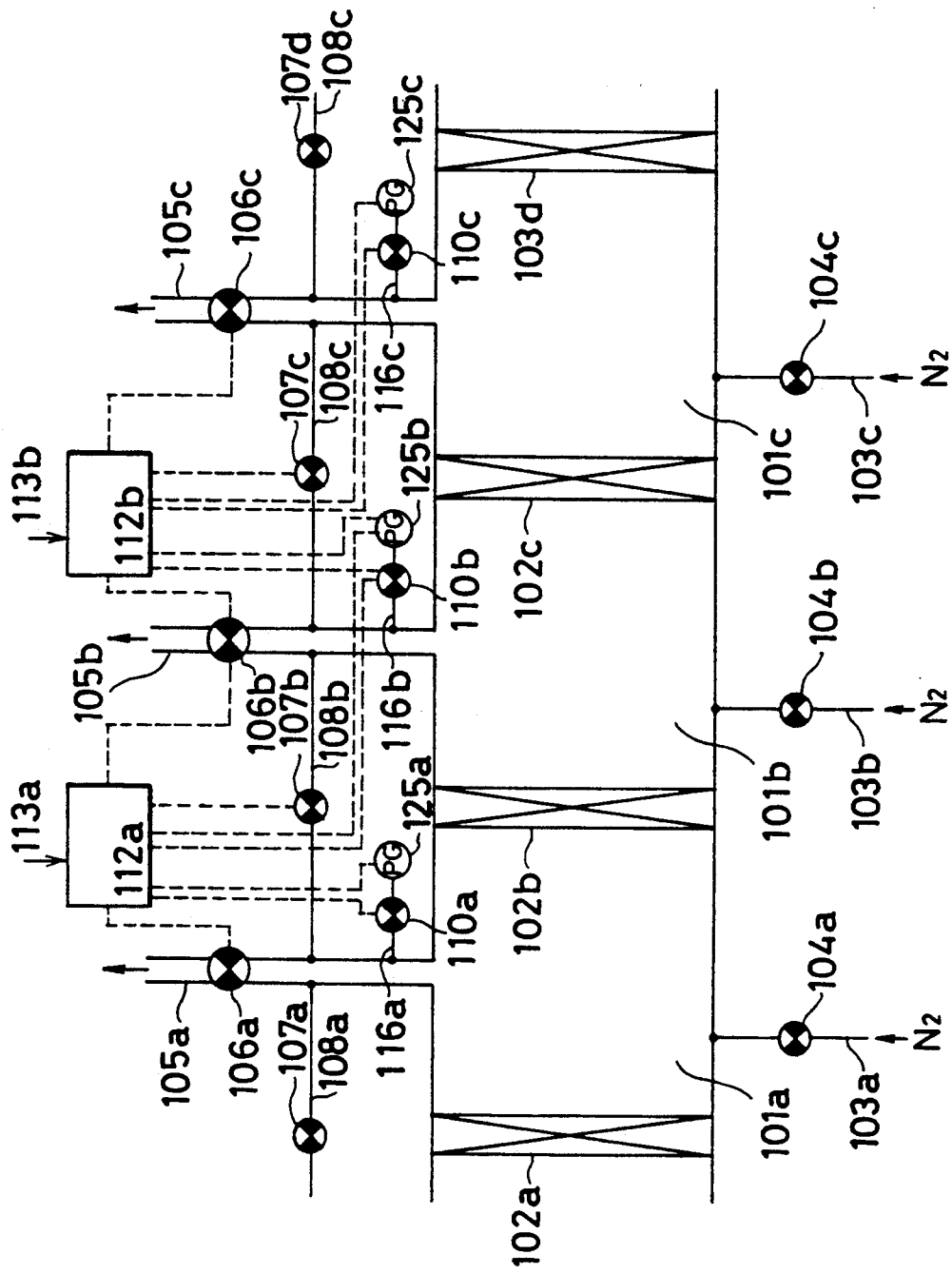
FIG. 9 is a schematical drawing of another embodiment of the present invention.

Description is now given on an embodiment of the semiconductor manufacturing equipment in FIG. 9.

A plurality of adjacent processing chambers 101 are connected with each other through gate valves 102, and a nitrogen gas supply line 103 and a gas discharge line 105 are connected to each of the adjacent processing chambers 101. An air valve 104 is mounted on the nitrogen gas supply line 103, and an air valve 106 on the gas discharge line 105.

A gas discharge line 105a connected to one of the adjacent processing chambers 101a and a gas discharge line 105b connected to the other of the adjacent processing chambers 101b are short-circuited by a connecting pipe 108b. A connecting pipe valve 107b is mounted on the connecting pipe 108b.

A pressure monitor pipe 116a is connected to the gas discharge line 105a, and an air valve 110a and a pressure gauge 125a are mounted on the pressure monitor pipe 116a. The pressure monitor pipe 116b is connected to the gas discharge line 105b, and an air valve 110b and a pressure gauge 125b are mounted on the pressure monitor pipe 116b.

A gas discharge line valve 106a is mounted on a portion of the gas discharge line 105a downstream of a connecting point of the connecting pipe 108b and the pressure monitor pipe 116a. A gas discharge line valve 106b is mounted on a portion of the gas discharge line 105b downstream of a connecting point of the connecting pipe 108b and the pressure monitor pipe 116b.

Detection signals from the pressure gauge 125a and 125b are inputted to a controller 112a, and the controller 112a compares the difference between the signals from the pressure gauge 125a and 125b with a preset reference value 113a, and the connecting pipe valve 107b is opened or closed. The controller 112a opens or closes the air valves 110a, 110b and the connecting pipe valve 107b, the gas discharge line valve 106a, and the gas discharge line valve 106b in accordance with operation sequence of the semiconductor manufacturing equipment in order to supply and discharge gas.

Similarly, a gas discharge line 105b connected to one of the adjacent processing chambers 101b and a gas discharge line 105c connected to the other of adjacent processing chambers 101c are short-circuited by a connecting pipe 108c, and a connecting pipe valve 107c is mounted on the connecting 108c. A pressure monitor pipe 116b is connected to the gas discharge line 105b, and an air valve 110b and a pressure gauge 125b are mounted on the pressure monitor pipe 116b. The pressure pipe 116c is connected to the gas discharge line 105c, and an air valve 110c and a pressure gauge 125c are mounted on the pressure monitor pipe 116c. A gas discharge line valve 106b is mounted on a portion of the gas discharge line 105b downstream of a connecting point of the connecting pipe 108c and the pressure monitor pipe 116b. A gas discharge line valve 106c is mounted on a portion of the gas discharge line 105c downstream of a connecting point of the connecting pipe 108c and the pressure monitor pipe 116c.

Detection signals from the pressure gauge 125b and 125c are inputted to a controller 112b, and the controller 112b compares the difference of the pressure gauge 125b and 125c with a preset reference value 113b, and the connecting pipe valve 107c is opened or closed. The controller 112b opens or closes the air valves 110b, 110c and the connecting pipe valve 107c, the gas discharge line valve 106b and the gas discharge line valve 106c in accordance with operation sequence of the semiconductor manufacturing equipment in order to supply and discharge gas.

As described above, each of the adjacent processing chambers 101 is provided with a similar gas supply and discharge mechanism respectively.

Description is now given on the operation of the present embodiment, referring to one of the adjacent processing chambers 101a and the other of the processing chambers 101b as well as the gate valve 102b between them.

With the air valve 107b in closed state and the air valve 110b in opened state, nitrogen gas is introduced through a nitrogen gas supply line 103b and the other of the adjacent processing chambers 101b is turned to nitrogen gas atmosphere. Then, the gas discharge line valve 106a is closed, and the air valve 110a is opened, and nitrogen gas is introduced into one of the adjacent processing chambers 101a through the nitrogen gas supply line 103a.

Pressure values in one of the adjacent processing chambers 101a and the other of the adjacent processing chambers 101b are detected by the pressure gauges 125a and 125b respectively, and the results are inputted to the controller 112a. The controller 112a compares the difference between the detection results of the pressure gauges 125a and 125b with a preset reference value 113a. When the difference of the detection results becomes the preset reference value 113a or smaller than it, the connecting pipe valve 107b is gradually opened in order to completely eliminate the pressure difference between one of the adjacent processing chambers 101a and the other of the adjacent processing chambers 101b.

By the arrangement as described above, it is possible to suppress rapid flow of gas caused by the pressure difference between one and the other of the adjacent processing chambers when the gate valve is opened, and to prevent dusting.

Figure 10:
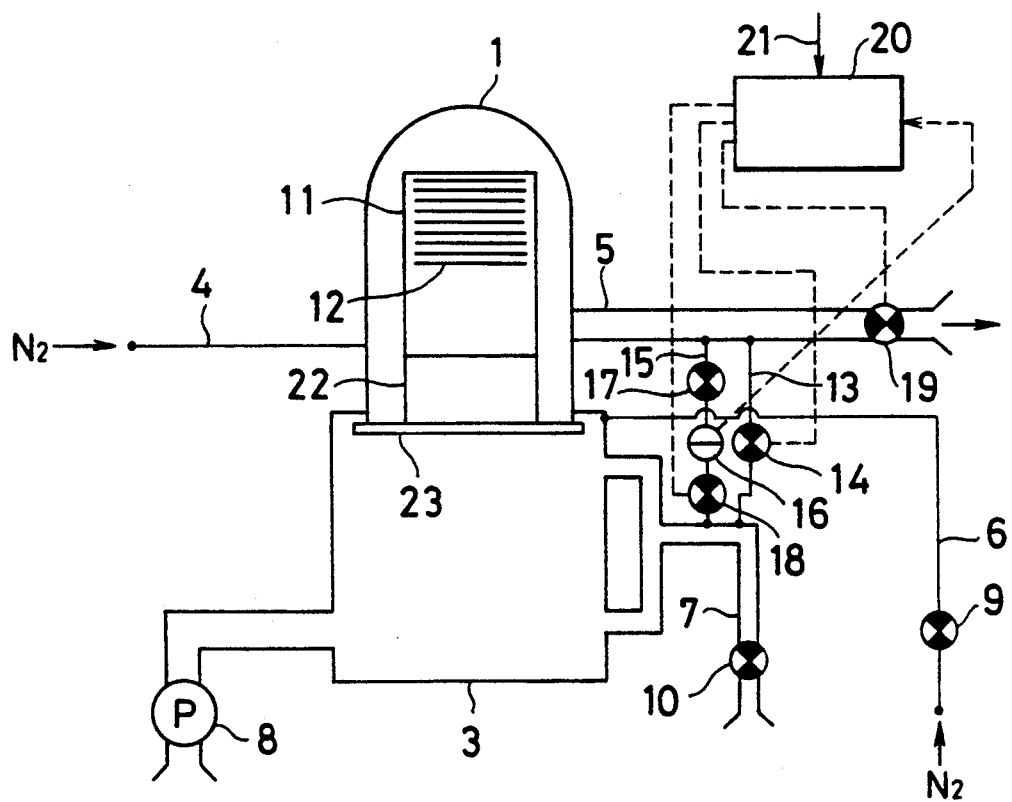
FIG. 10 is a schematical drawing of another embodiment of the present invention.

Description is now given on an embodiment of a vertical diffusion/CVD system provided with a load-lock chamber in FIG. 10. The same component as in FIG. 19 is referred by the same symbol, and detailed description is not given here.

The gas discharge line 5 and the gas discharge line 7 are short-circuited by a connecting pipe 13, and the gas discharge line 5 and the gas discharge line 7 are connected by a differential pressure detecting pipe 15. A connecting pipe valve 14 is mounted on the connecting pipe 13, and two air valves 17 and 18 are mounted on the differential pressure detecting pipe 15. A differential pressure gauge 16 is mounted between the two air valves 17 and 18. A gas discharge line valve 19 is mounted on a portion of the gas discharge line 5 downstream of a connecting point of the connecting pipe 13 and the differential pressure detecting pipe 15. An elevator cap 23 is connected to a boat elevator (not shown). A quartz cap 22 and a boat 11 are placed on the elevator cap 23, and a wafer 12 is loaded on the boat 11.

Detection signal from the differential pressure detecting pipe 15 is inputted to a controller 20, and the controller 20 opens or closes the connecting pipe valve 14 according to the result of comparison of the signal from the differential pressure detecting pipe 15 with a preset reference value 21. The controller 20 opens or closes air valves 9 and 10, the air valves 17 and 18, and a gas discharge line valve 19 and moves the elevator cap 23 up and down in accordance with operation sequence of the vertical diffusion/CVD system in order to supply and discharge gas.

Description is now given on the operation.

When the elevator cap 23 is moved up and it is desired to move the elevator cap 23 down from the condition where a reaction chamber 1 is sealed by the elevator cap 23, it is operated as follows: With the connecting pipe valve 14 and the air valves 17 and 18 in closed state, nitrogen gas is introduced through a nitrogen gas supply line 6 to turn the load-lock chamber 3 to nitrogen gas atmosphere. Then, the two air valves 17 and 18 are opened, and the gas discharge line valve 19 is closed. Nitrogen gas is introduced into the reaction chamber 1 through the nitrogen gas supply line 4.

The pressure difference between the reaction chamber 1 and the load-lock chamber 3 detected by the differential pressure gauge 16, and the detection result is inputted to the controller 20 as described above. The controller 20 compares the detection result of the differential pressure gauge 16 with the preset reference value 21. When the detection result becomes the preset reference value 21 or smaller than it, the connecting pipe valve 14 is opened in order to completely eliminate the pressure difference between the reaction chamber 1 and the load-lock chamber 3. When a certain period of time has elapsed after the connecting pipe valve 14 has been opened, or when pressure difference is no more detected by monitoring of the differential pressure gauge 16, the elevator cap 23 is moved down.

By such operation, it is possible to suppress rapid flow of gas caused by the pressure difference between the reaction chamber 1 and the load-lock chamber 3 when the elevator cap 23 is moved down, and to prevent dusting.

Figure 11:
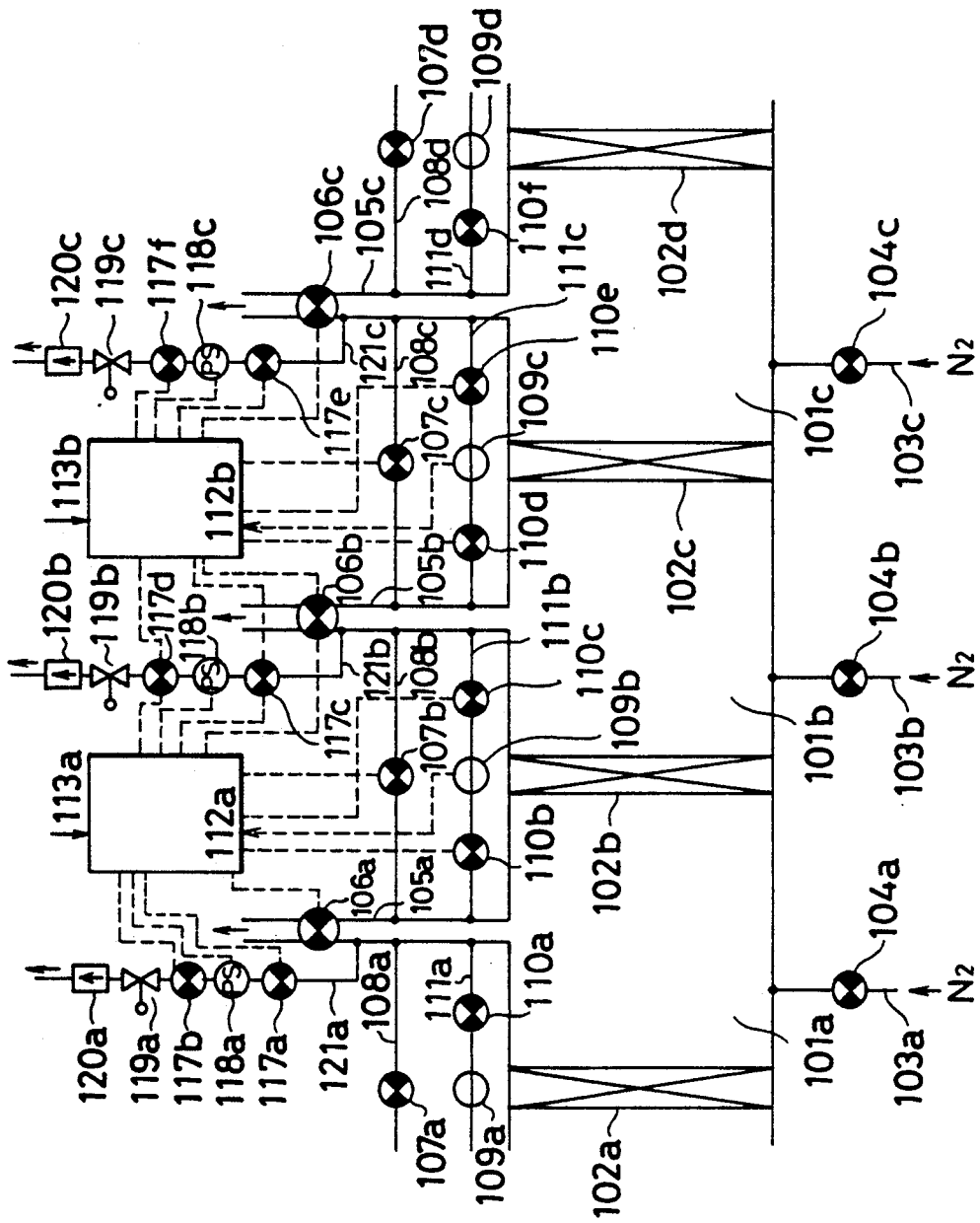
FIG. 11 is a schematical drawing of another embodiment of the present invention.

Description is now given on an embodiment of the semiconductor manufacturing equipment in FIG. 11.

A plurality of adjacent processing chambers 101 are connected with each other through gate valves 102, and a nitrogen gas supply line 103 and a gas discharge line 105 are connected to each of the adjacent processing chambers 101. An air valve 104 is mounted on the nitrogen gas supply line 103, and an air valve 106 on the gas discharge line 105.

A gas discharge line 105a connected to one of the adjacent processing chambers 101a and a gas discharge line 105b connected to the other of the adjacent processing chambers 101b are short-circuited by a connecting pipe 108b, and the gas discharge line 105a and the gas discharge line 105b are connected by a differential pressure detecting pipe 111b. A gas release line 121a is mounted on the gas discharge line 105a, and a gas release line 121b is mounted on the gas discharge line 105b.

A connecting pipe valve 107b is mounted on the connecting pipe 108b, and two air valves 110b and 110c are mounted on the differential pressure detecting pipe 111b. A differential pressure gauge 109b is mounted on the two air valves 110b and 110c.

The gas release line 121a is provided with an air valve 117a, a pressure switch 118a, an air valve 117b, a flow control valve 119a, and a check valve 120a from upstream. The gas release line 121b is provided with an air valve 117c, a pressure switch 118b, an air valve 117d, a flow control valve 119b, and a check valve 120b from upstream.

A gas discharge line valve 106a is mounted on a portion of the gas discharge line 105a downstream of a connecting point of the gas release pipe 121a, the connecting pipe 108b, and the differential pressure detecting pipe 111b. A gas discharge line valve 106b is mounted on a portion of the gas discharge line 105b downstream of a connecting point of the gas release pipe 121b, the connecting pipe 108b, and the differential pressure detecting pipe 111b.

Detection signal from the differential pressure gauge 109b is inputted to a controller 112a, and the controller 112a opens or closes the connecting pipe valve 107b according to the result of comparison of the signal from the differential pressure gauge 109b with a preset reference value 113a. The controller 112a opens or closes the air valves 110b and 110c, the connecting pipe valve 107b, the gas discharge line valve 106a, the gas discharge line valve 106b, and the air valves 117a, 117b, 117c, and 117d in accordance with operation sequence of the semiconductor manufacturing equipment in order to supply and discharge gas.

Similarly, a gas discharge line 105b connected to one of the adjacent processing chambers 101b and a gas discharge line 105c connected to the other of the adjacent processing chambers 101c are short-circuited by a connecting pipe 108c, and the gas discharge line 105b and the gas discharge line 105c are connected by a differential pressure detecting pipe 111c. A gas release line 121b is mounted on the gas discharge line 105b, and a gas release line 121c is mounted on the gas discharge line 105c. A connecting pipe valve 107c is mounted on the connecting pipe 108c, and two air valves 110d and 110e are mounted on the differential pressure detecting pipe 111c. A differential pressure gauge 109c is mounted between the two air valves 110d and 110e.

The gas release line 121b is provided with an air valve 117c, a pressure switch 118b, an air valve 117d, a flow control valve 119b, and a check valve 120b from upstream. The gas release line 121c is provided with an air valve 117e, a pressure switch 118c, an air valve 117f, a flow control valve 119c, and a check valve 120c from upstream.

A gas discharge line valve 106b is mounted on a portion of the gas discharge line 105b downstream of a connecting point of the gas release line 121b, the connecting pipe 108c, and the differential pressure detecting pipe 111c. A gas discharge line valve 106c is mounted on a portion of the gas discharge line 105c downstream of a connecting point of the gas release line 121c, the connecting pipe 108c, and the differential pressure detecting pipe 111c.

Detection signal from the differential pressure gauge 109c is inputted to a controller 112b, and the controller 112b opens or closes the connecting pipe valve 107c according to the result of comparison of the signal from the differential pressure gauge 109c with a preset reference value 113b. The controller 112b opens or closes the air valves 110d and 110e, the connecting pipe valve 107c, the gas discharge line valve 106b, the gas discharge line valve 106c, and air valves 117c, 117d, 117e, and 117f in accordance with operation sequence of the semiconductor manufacturing equipment in order to supply and discharge gas.

As described above, each of the adjacent processing chambers 101 is provided with a similar gas supply and discharge mechanism respectively.

Description is now given on the the operation of the present embodiment, referring to one of the adjacent processing chambers 101a and the other of the processing chamber 101b as well as the gate valve 102b between them.

With the gas discharge line valve 106b, the connecting pipe valve 107b, the air valves 110b and 110c and the air valve 117d in closed state and with the air valve 117c in opened state, nitrogen gas is introduced through a nitrogen gas supply line 103b to turn the other of the adjacent processing chambers 101b to nitrogen gas atmosphere. The atmospheric pressure is detected by a pressure switch 118b. Then, the air valve 117d is opened, and the processing chamber 101b is maintained near the atmospheric pressure.

The open cross-sectional area of the gas release line 121b is made variable by the flow control valve 119b used on the gas release line 121b, and the check valve 120b prevents back flow of gas.

Figure 12:
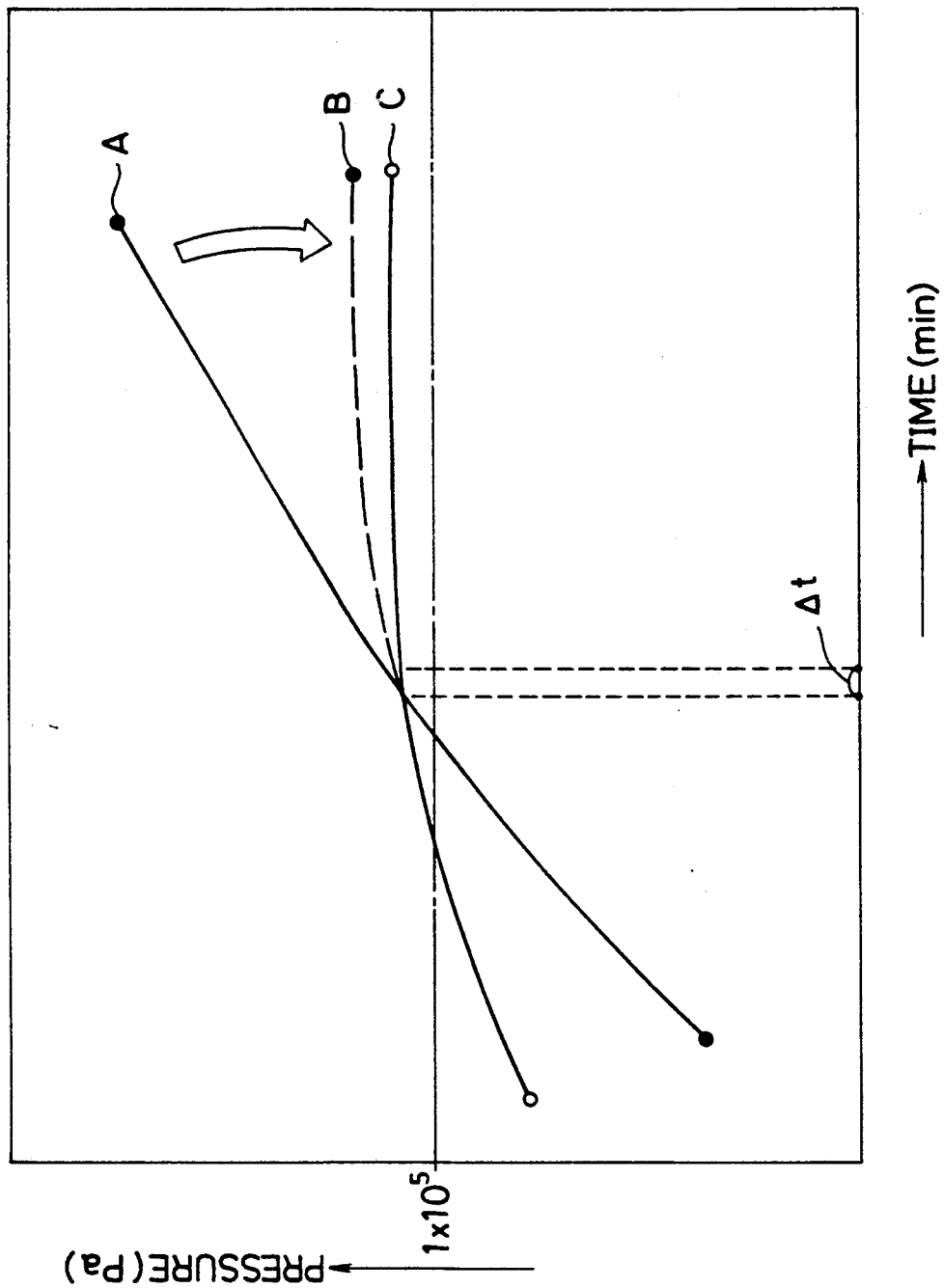
FIG. 12 is a drawing for explaining the operation of the embodiment of FIG. 11.

The transition of pressure in the processing chamber 101b is as shown by the curve C in FIG. 12. As nitrogen gas is released from the gas release line 121b, the pressure in the processing chamber 101b is not increased higher than a certain value as shown by the curve C in FIG. 12.

The two air valves 110b and 110c are opened, and the gas discharge line valve 106a is closed, and the air valve 117a is opened. From the nitrogen gas supply line 103a, nitrogen gas is introduced into one of the adjacent processing chambers 101a. When atmospheric pressure is reached and it is detected by the pressure switch 118a, the air valve 117b is opened. Nitrogen gas is released from the gas release line 121a, and the pressure in the processing chamber 101a is maintained near the atmospheric pressure.

The pressure in the processing chamber 101a is by the curve B in FIG. 12, and the value closer to the curve C, i.e. the pressure in the processing chamber 101b, is maintained. If the gas release line 121 is not present, the pressure in the processing chamber 101a is increased by introducing nitrogen gas in relation to the pressure curve C in the processing chamber 101b at a constant level, and the pressure transition is as shown by the curve A.

Pressure difference between one of the adjacent processing chambers 101a and the other of the adjacent processing chambers 101b is detected by the differential pressure gauge 109b, and the detection result is inputted to a controller 112a. The controller 112a compares the detection result of the differential pressure gauge 109b with the preset reference value 113a. When the detection result becomes smaller than the preset reference value 113a, the connecting pipe valve 107b is opened in order to completely eliminate the pressure difference between one of the adjacent processing chambers 101a and the other of the adjacent processing chambers 101b. The timing to open the connecting pipe valve 107b is near the intersection of the curves B and C (Δt) in FIG. 12. If the gas release line 121 is not present, the pressure relationship between the processing chambers 101a and 101b is as the relationship between the curves A and C, and the timing to open the connecting pipe valve 107b is near the intersection of the curves A and C (Δt) in FIG. 12. When comparison is made between the case where the gas release line 121 is present and the case where it is not, the pressure difference from the curve C can be made smaller by the curve B than by the curve A within the range of Δt of the timing to open the connecting pipe valve 107b due to measurement error of the differential pressure gauge 109b or operation delay of the connecting pipe valve 107b. When a certain period of time has elapsed after the connecting pipe valve 107b has been opened or when pressure difference is no more monitored by the differential pressure gauge 109b, the gate valve 102b is opened.

By the arrangement as described above, it is possible to suppress rapid flow of gas caused by the pressure difference between one and the other of the adjacent processing chambers when the gate valve is opened, and to prevent dusting.

Description is given now on the controllers 20 and 112 to control pressure equalization, referring to FIG. 13, FIG. 14, FIG. 15, FIG. 16 and FIG. 17.

Description is given on the operation of the controllers 20 and 112, which comprise preset value memory means 200 for inputting and memorizing preset reference values 21 and 113, valve opening control means 201 for controlling valve opening by differential pressure from the differential pressure gauge 109 to obtain differential pressure between one and the other of the adjacent processing chambers and by the preset reference value memory means 200, differential pressure/valve opening defining means 202 for defining opening of the gas supply line valve and opening of the gas discharge line valve by differential pressure, gas supply line valve opening adjusting means 203 for setting gas supply quantity through direct control of the gas supply line valve 104, and gas discharge line valve opening adjusting means 204 for setting gas discharge quantity through direct control of the gas discharge line valve 106.

Differential pressure is obtained from the differential pressure gauge 109 to obtain differential pressure between one and the other of the adjacent processing chambers, and the preset reference value in the preset reference value memory means 200 is read by the valve opening control means 201, and the differential pressure is compared with the preset reference value. As the result, if the differential pressure is higher than the preset reference value, the valve opening control means 201 controls the gas supply line valve opening adjusting means 203 and the gas discharge line valve opening adjusting means 204 based on the value defined by the differential pressure/valve opening defining means 202. The gas supply line valve opening adjusting means 203 and the gas discharge line valve opening adjusting means 204 adjust and control the gas supply line valve 104 and the gas discharge valve 106 respectively. Thus, it is possible to change gas discharge characteristics and to shorten the time ta, which is required until the differential pressure reaches the preset reference value from the condition shown in FIG. 16 to that of FIG. 17.

If the differential pressure is equal to or smaller than the preset reference value, the valve opening control means 201 controls the gas supply line valve opening adjusting means 203 and the gas discharge line valve opening adjusting means 204 based on the value defined by the differential pressure/valve opening defining means 202. The gas supply line valve opening adjusting means 203 and the gas discharge line valve opening adjusting means 204 shut off the gas supply line valve 104 and the gas discharge valve 106 respectively, and open the pressure equalizing valve 117. As the result, even when the gate valve between one and the other of the adjacent processing chambers is opened, particles are not generated.

Figure 18:
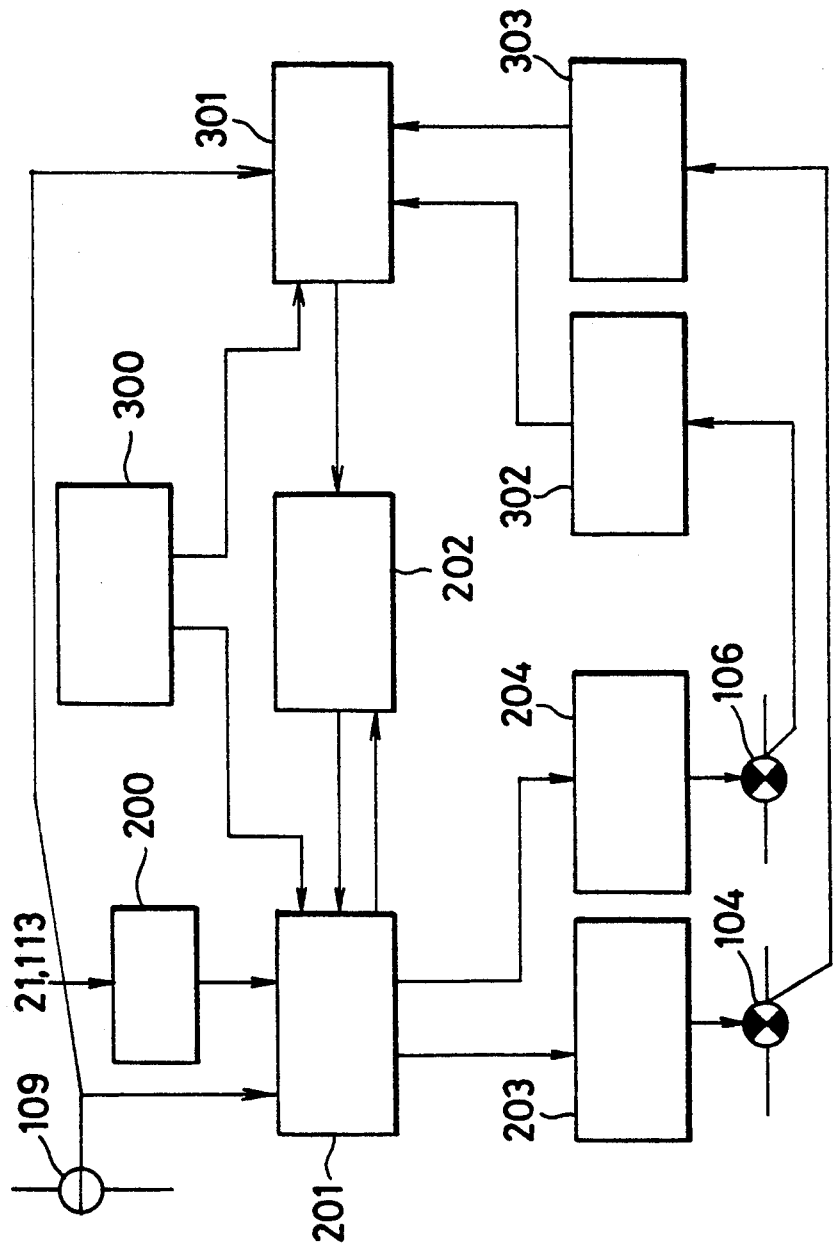
FIG. 18 is a block diagram of another controller to be used in the present invention.

Description is given on another embodiment relating to the controllers 20 and 112, referring to FIG. 18.

Description is given on the operation of the controllers 20 and 112, which comprise preset value memory means 200 for inputting and memorizing the preset reference values 21 and 113, valve opening control means 201 for controlling valve opening by differential pressure from the differential pressure gauge 109 to obtain differential pressure between one and the other of the adjacent processing chambers and by the preset reference value memory means 200, differential pressure/valve opening defining means 202 for defining opening of the gas supply line valve and opening of the gas discharge line valve by the differential pressure, gas supply line valve opening adjusting means 203 for setting gas supply quantity through direct control of the gas supply line valve 104, gas discharge line valve opening adjusting means 204 for setting gas discharge quantity through direct control of the gas discharge line valve 106, operation mode switching means 300 for switching operations between control of valve opening and learning of valve opening, differential pressure/valve opening learning means 301 for making the differential pressure/valve opening defining means 202 learn a new definition by obtaining the values of differential pressure and the values of gas supply line valve opening and the gas discharge line valve opening, gas supply line valve opening reading means 302 for reading opening of the gas supply line, and gas discharge line valve opening reading means 303 for reading opening of the gas discharge line.

Figure 13:
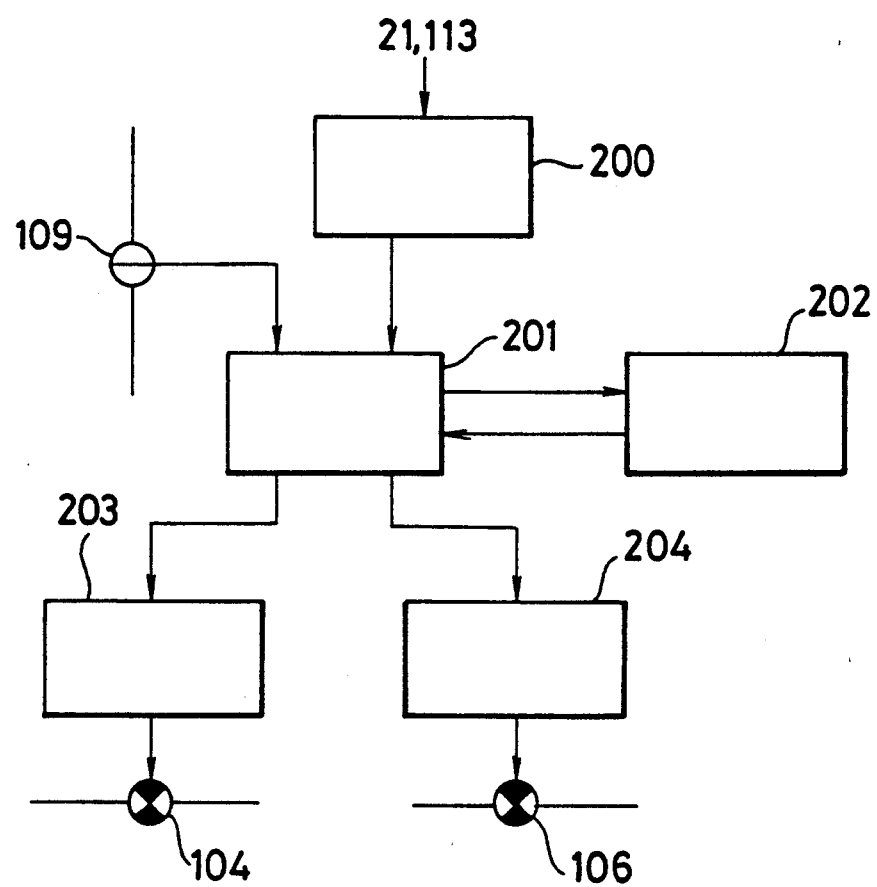
FIG. 13 is a block diagram of a controller according to the present invention.
Figures 14, 15:
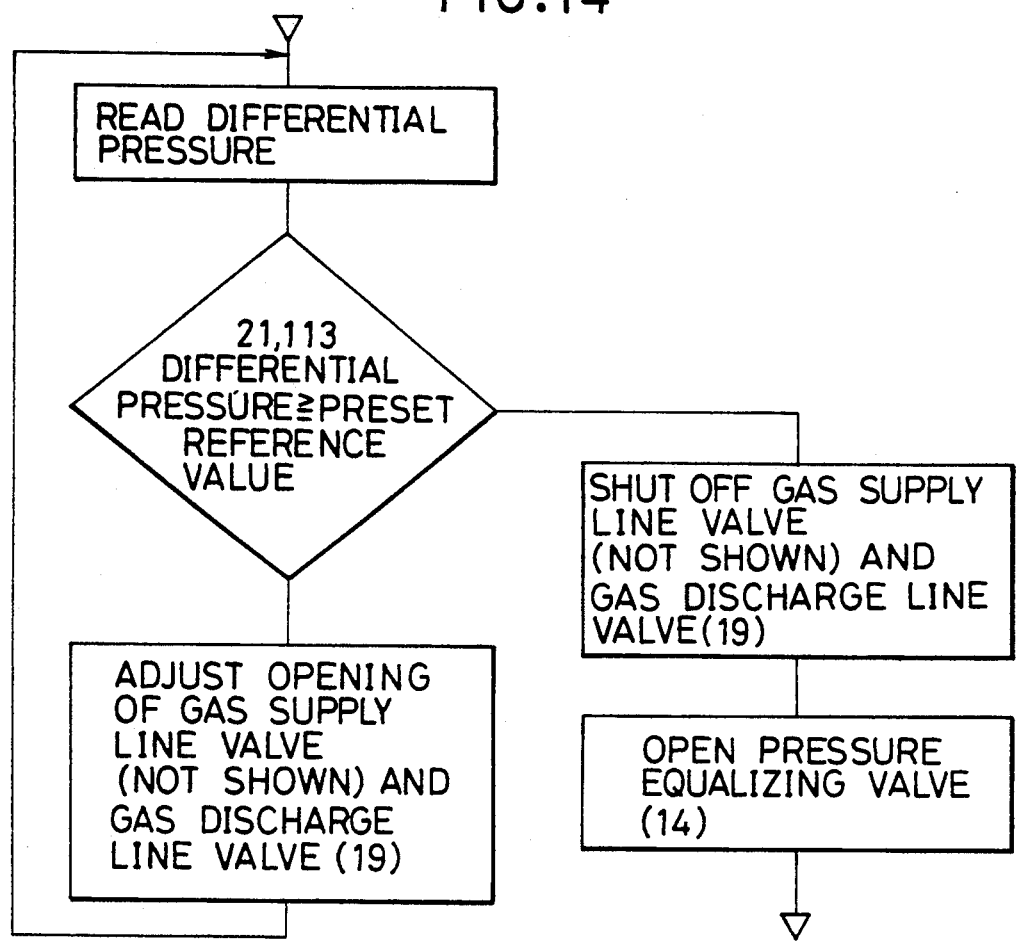
FIG. 14 is a flow chart showing operation of the controller.
FIG. 15 is a definition drawing of the controller.
Figure 16:
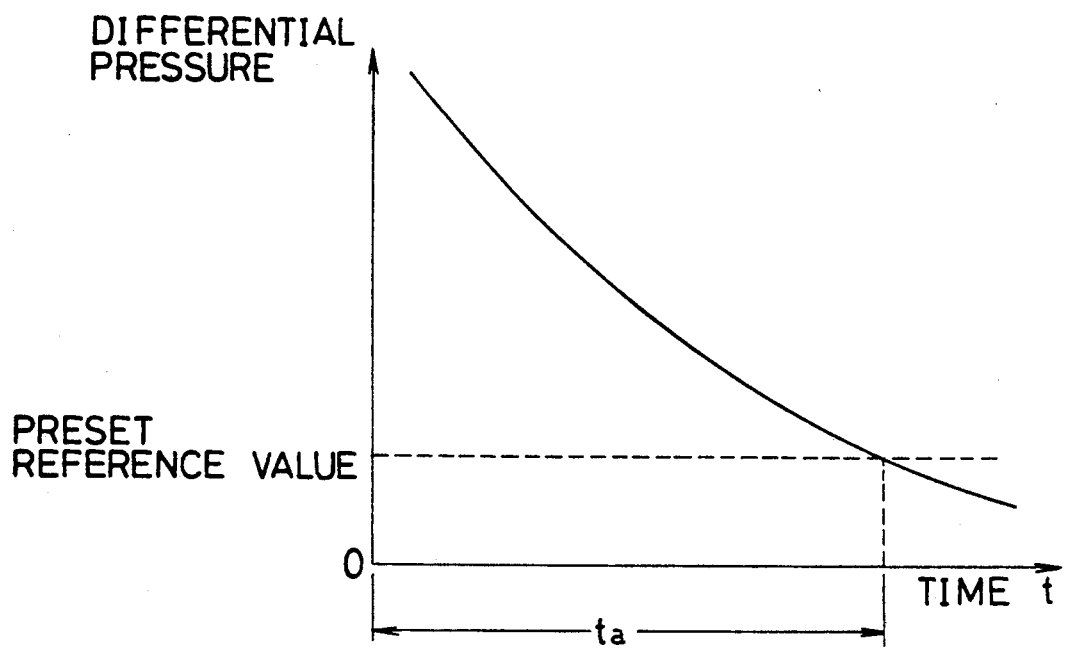
FIG. 16 is a drawing for explaining the operation of the controller.
Figure 17:
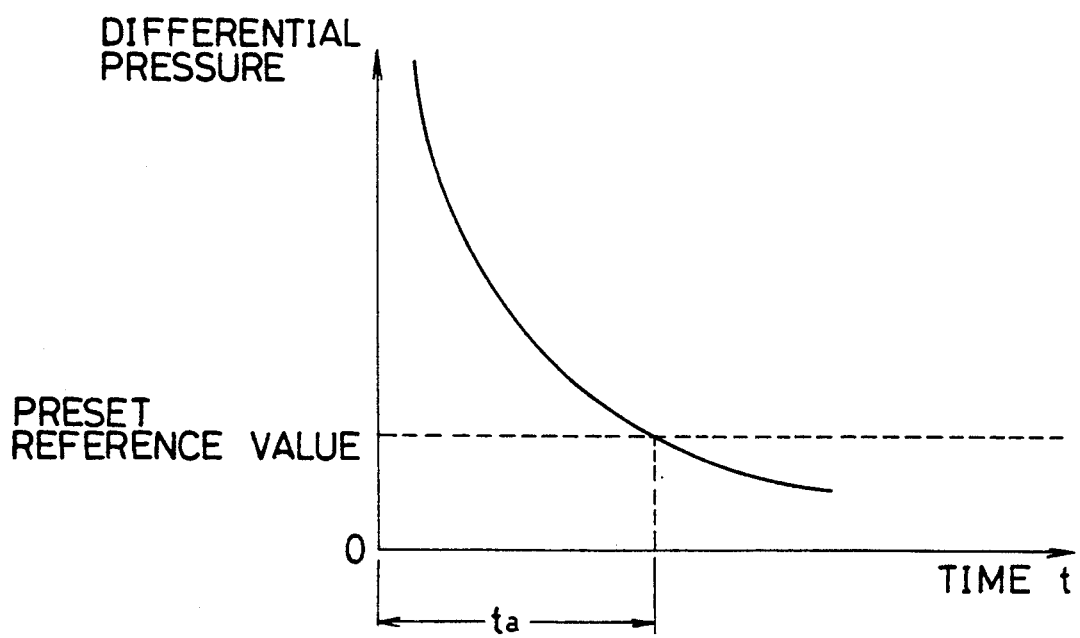
FIG. 17 is a drawing for explaining the operation of the controller.

When the operation mode switching means 300 selects the valve opening control means 201, the operation is the same as that of the controllers 20 and 112 in FIG. 13.

When the operation mode switching means 300 selects the differential pressure/valve opening learning means 301, differential pressure by the differential pressure gauge is read by the differential pressure/valve opening learning means 301, and openings of the manually operated gas supply line valve 104 and the gas discharge line valve 106 are read by the gas supply line valve opening reading means 302 and the gas discharge line valve opening reading means 303. Then, the relationship between the differential pressure and the opening values is read by the differential pressure/valve opening learning means 301, and the relationship between the differential pressure and the openings of the gas supply line valve 104, the gas discharge line valve 106 is set on the differential pressure/valve opening defining means 202.

By the above procedure, it is possible to achieve optimal operation with the preset definition value when the operation mode switching means 300 selects the operation by the valve opening control means 201.

As described above, it is possible to shorten the pressure equalizing time while preventing dusting, and it is possible to effectively increase the throughput.

What we claim is:

1. A method for supplying and discharging gas in a semiconductor manufacturing equipment, comprising a reaction chamber, a load-lock chamber, and blocking means for opening and blocking between the reaction chamber and the load-lock chamber, whereby one of the reaction chamber or the load-lock chamber is filled with inert gas such as nitrogen gas, the replacement gas is supplied to the other of the reaction chamber or the load-lock chamber, and when pressure difference between the reaction chamber and the load-lock chamber becomes lower than a predetermined value, the reaction chamber and the load-lock chamber are communicated with each other and pressure is equalized, and said locking means is opened after pressure has been equalized.

2. A method for supplying and discharging gas in a semiconductor manufacturing equipment according to claim 1, wherein the blocking means is a gate valve.

3. A method for supplying and discharging gas in a semiconductor manufacturing equipment according to claim 1, wherein the blocking means is an elevator cap, which is provided in a load-lock chamber and can be moved up and down.

4. A method for supplying and discharging gas in a semiconductor manufacturing equipment, which comprises a plurality of processing chambers connected through a gate valve, whereby one of the adjacent processing chambers is filled with inert gas such as nitrogen gas, the replacement gas is supplied to the other of the adjacent processing chambers, and when pressure difference between the adjacent processing chambers becomes lower than a predetermined value, the adjacent processing chambers are communicated and pressure is equalized, and the gate valve is opened after pressure has been equalized.

5. A method for supplying and discharging gas in a semiconductor manufacturing equipment comprising a plurality of processing chambers connected by a gate valve according to claim 4, wherein one of the adjacent processing chambers is filled with inert gas such as nitrogen gas, the processing chamber is maintained at atmospheric pressure, the replacement gas is supplied to the other of the adjacent processing chambers, and the processing chamber is similarly maintained at atmospheric pressure.

6. A system for supplying and discharging gas in a semiconductor manufacturing equipment, comprising a reaction chamber, a load-lock chamber connected to said reaction chamber through a gate valve, a gas supply line and a gas discharge line communicated with said reaction chamber, another gas supply line and another gas discharge line communicated with said load-lock chamber, a detector for detecting pressure difference between said reaction chamber and said load-lock chamber, and a valve for communicating the discharge line of the reaction chamber with the discharge line of the load-lock chamber and opened when said pressure difference becomes lower than a predetermined value.

7. A system for supplying and discharging gas in a semiconductor manufacturing equipment, comprising a plurality of processing chambers connected through a gate valve, a gas supply line and gas discharge line communicated with one of the adjacent processing chambers, and another gas supply line and another gas discharge line communicated with the other of the adjacent processing chambers, a detector for detecting pressure difference between said two adjacent processing chambers, and a valve for communicating the discharge line of one of the adjacent processing chambers with the discharge line of the other of the adjacent processing chambers and being opened when said pressure difference becomes lower than a predetermined value.

8. A system for supplying and discharging gas in a semiconductor manufacturing equipment, comprising a plurality of processing chambers connected through a gate valve, a gas supply line and a gas discharge line communicated with one of the adjacent processing chambers, and another gas supply line and another gas discharge line communicated with the other of the adjacent processing chambers, a detector for detecting pressure difference between said two adjacent processing chambers, and a valve for communicating the supply line of one of the adjacent processing chambers with the supply line of the other of the adjacent processing chambers and being opened when the pressure difference between one and the other of the adjacent processing chambers is lower than a predetermined value.

9. A system for supplying and discharging gas in a semiconductor manufacturing equipment according to claim 7 or claim 8, wherein the gas discharge line communicated with one of the adjacent processing chambers is not straight, and the gas discharge line communicated with the other of the adjacent processing chambers is not straight.

10. A system for supplying and discharging gas in a semiconductor manufacturing equipment according to claim 7, wherein the valve is a flow control valve and the flow control valve is opened while adjusting the opening when pressure difference between one and the other of the adjacent processing chambers is lower than a predetermined value.

11. A system for supplying and discharging gas in a semiconductor manufacturing equipment, comprising a plurality of processing chambers connected through a gate valve, a gas supply line and a gas discharge line communicated with one of the adjacent processing chambers, another gas supply line and another gas discharge line communicated with the other of the adjacent processing chambers, a pressure detector provided in each of the adjacent processing chambers, and a valve for communicating the discharge line of one of the adjacent processing chamber with the discharge line of the other of the adjacent processing chambers and being opened when the pressure of the two chambers detected by said pressure detector becomes a predetermined value or more than the predetermined value.

12. A system for supplying and discharging gas in a semiconductor manufacturing equipment, comprising a plurality of processing chambers connected through a gate valve, a gas supply line and a gas discharge line communicated with one of the adjacent processing chambers, another gas supply line and another gas discharge line communicated with the other of the adjacent processing chambers, a pressure detector provided in each of said adjacent processing chambers, a controller for comparing pressure in the two processing chambers detected by the two pressure detectors, and a valve for communicating the discharge line of one of the adjacent processing chambers with the discharge line of the other of the adjacent processing chambers, and being opened when the compared value is below a predetermined value.

13. A system for supplying and discharging gas in a semiconductor manufacturing equipment according to claim 11 or claim 12, wherein the valve is a flow control valve and the flow control valve is opened while adjusting the opening.

14. A system for supplying and discharging gas in a semiconductor manufacturing equipment according to claim 7, wherein a gas release line is connected to the gas discharge line or the processing chamber, and there are provided a detector for detecting atmospheric pressure, a flow control valve, a check valve, and a valve for gas release, and the valve for gas release is opened when atmospheric pressure is detected by said detector.

15. A system for supplying and discharging gas in a semiconductor manufacturing equipment according to claim 7 or claim 12, wherein there are provided preset reference value memory means for memorizing a predetermined pressure difference value, differential pressure/valve opening defining means for defining valve opening of the gas supply line corresponding to the differential pressure and valve opening of the gas discharge line, valve opening control means for reading corresponding valve opening from the differential pressure/valve opening defining means according to the differential pressure value, and for setting and instructing the opening of the valve to the gas supply line valve opening adjusting means or gas discharge line valve opening adjusting means.

16. A system for supplying and discharging gas in a semiconductor manufacturing equipment according to claim 7 or claim 12, wherein there are provided preset reference value memory means for memorizing a predetermined pressure difference value, differential pressure/valve opening defining means for memorizing valve opening of the gas supply line corresponding to differential pressure and valve opening of the gas discharge line, valve opening control means for reading corresponding valve opening from differential pressure/valve opening defining means according to the differential pressure value and for setting and instructing opening of valve to the gas supply line valve opening adjusting means or the gas discharge line valve opening adjusting means, operation mode switching means, and differential pressure/valve opening learning means for reading opening of the gas supply line valve from the gas supply line valve opening reading means and opening of the gas discharge line valve from the gas discharge line valve opening reading means when learning running mode is designated by said switching means, and for writing and memorizing the openings together with the differential pressure valve in the differential pressure/valve opening defining means.

* * * * *